US009754877B2

(12) United States Patent
Takahashi et al.

(10) Patent No.: US 9,754,877 B2
(45) Date of Patent: Sep. 5, 2017

(54) SEMICONDUCTOR DEVICE

(71) Applicant: Renesas Electronics Corporation, Koutou-ku, Tokyo (JP)

(72) Inventors: Yukio Takahashi, Hitachinaka (JP); Hitoshi Matsuura, Hitachinaka (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/242,788

(22) Filed: Aug. 22, 2016

(65) Prior Publication Data
US 2017/0062336 A1    Mar. 2, 2017

(30) Foreign Application Priority Data
Aug. 26, 2015 (JP) .................................. 2015-166814

(51) Int. Cl.
| | |
|---|---|
| *H01L 23/525* | (2006.01) |
| *H01L 29/06* | (2006.01) |
| *H01L 29/40* | (2006.01) |
| *H01L 27/02* | (2006.01) |
| *H01L 29/66* | (2006.01) |
| *H01L 29/739* | (2006.01) |
| H01L 21/66 | (2006.01) |

(52) U.S. Cl.
CPC ...... *H01L 23/5258* (2013.01); *H01L 27/0255* (2013.01); *H01L 29/0619* (2013.01); *H01L 29/402* (2013.01); *H01L 29/66348* (2013.01); *H01L 29/7397* (2013.01); *H01L 22/22* (2013.01)

(58) Field of Classification Search
None
See application file for complete search history.

(56) References Cited

U.S. PATENT DOCUMENTS

| | | | | | |
|---|---|---|---|---|---|
| 5,266,829 | A | * | 11/1993 | Hamdy | ............... H01L 23/5252 257/530 |
| 5,493,148 | A | * | 2/1996 | Ohata | .................... H01C 17/22 257/529 |
| 6,597,013 | B2 | * | 7/2003 | Romas, Jr. | .......... H01L 23/5256 257/208 |
| 7,193,292 | B2 | * | 3/2007 | Liaw | ................... H01L 23/5258 257/355 |
| 7,923,811 | B1 | * | 4/2011 | Im | ....................... H01L 23/5256 257/209 |

(Continued)

FOREIGN PATENT DOCUMENTS

| | | |
|---|---|---|
| JP | 2001-177093 A | 6/2001 |
| JP | 2005-19620 A | 1/2005 |

(Continued)

*Primary Examiner* — Benjamin Sandvik
(74) *Attorney, Agent, or Firm* — Sughrue Mion, PLLC

(57) ABSTRACT

A semiconductor device includes: a semiconductor substrate having a main surface; a first insulating film formed in a convex shape and provided on the main surface of the semiconductor substrate; a first diffusion layer formed on the semiconductor substrate and provided to surround the first insulating film formed in a convex shape, the first diffusion layer being different in conductivity type from the semiconductor substrate; a first conductive layer formed so as to extend across the first insulating film formed in a convex shape, the first conductive layer forming a fuse element; and a second insulating film provided on the first conductive layer.

20 Claims, 45 Drawing Sheets

(56) References Cited

U.S. PATENT DOCUMENTS

| | | |
|---|---|---|
| 2006/0087002 A1 | 4/2006 | Miwa et al. |
| 2007/0090486 A1* | 4/2007 | Otsuka ................ H01L 23/5256 |
| | | 257/529 |
| 2009/0322417 A1* | 12/2009 | Hirler ................... H01L 29/407 |
| | | 327/543 |
| 2012/0001295 A1* | 1/2012 | Kurz ................... H01L 23/5256 |
| | | 257/529 |

FOREIGN PATENT DOCUMENTS

| | | |
|---|---|---|
| JP | 2006-156960 A | 6/2006 |
| JP | 2010-56557 A | 3/2010 |

* cited by examiner

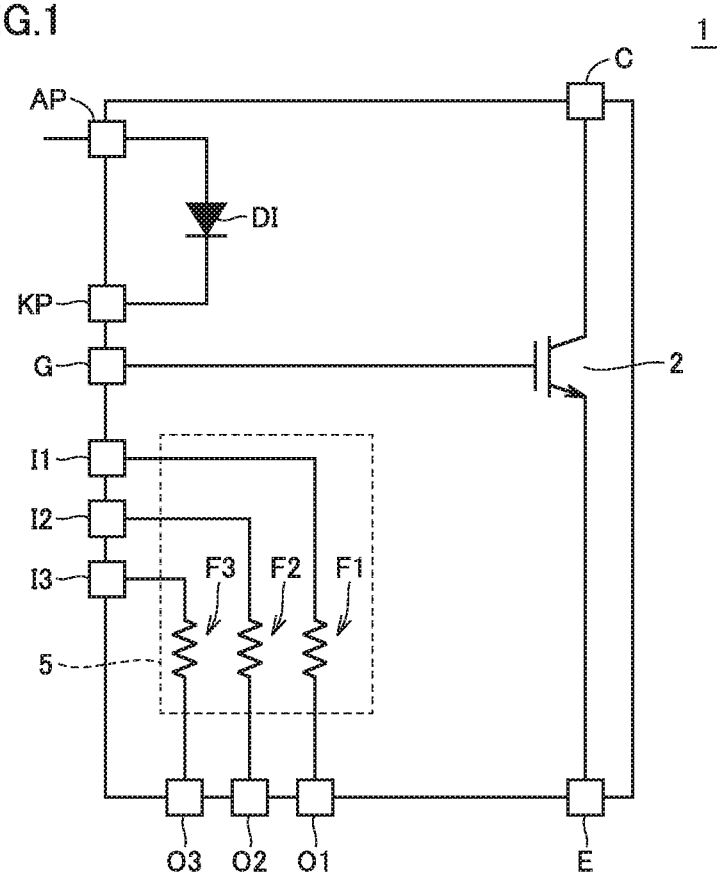

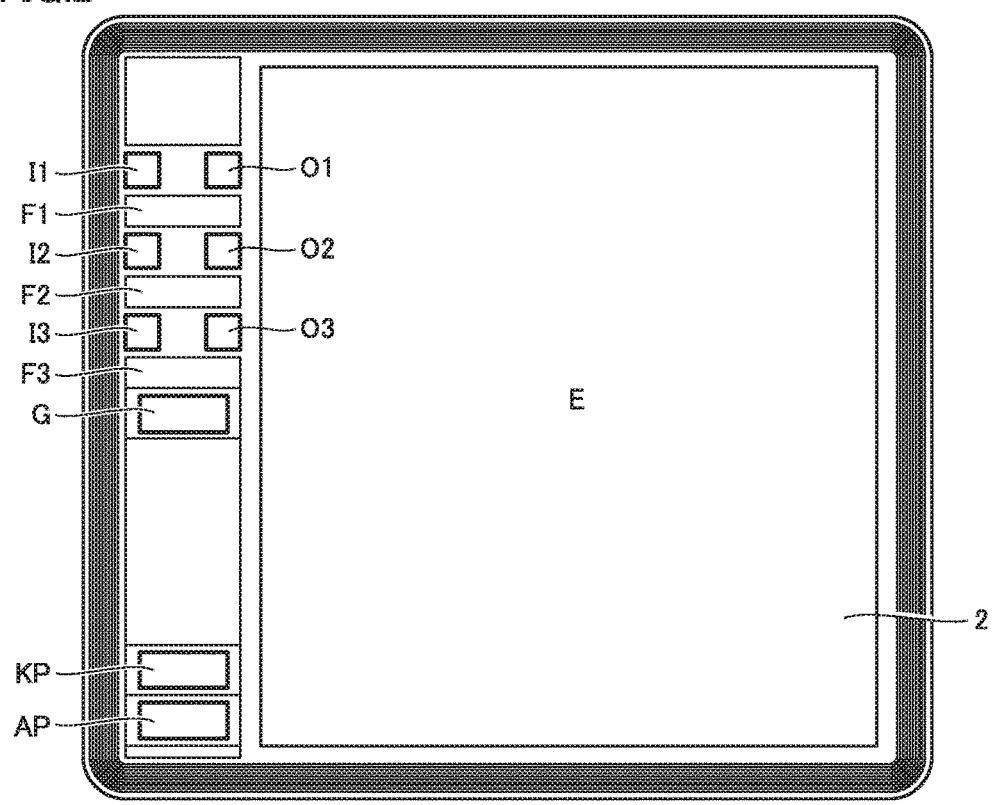

SEMICONDUCTOR DEVICE

This nonprovisional application is based on Japanese Patent Application 2015-166814 filed on Aug. 26, 2015, with the Japan Patent Office, the entire contents of which are hereby incorporated by reference.

BACKGROUND OF THE INVENTION

Field of the Invention

The present disclosure relates to a semiconductor device and particularly to a fuse element.

Description of the Background Art

Conventionally, a semiconductor integrated circuit commonly includes a circuit for adjusting a resistance value, which is referred to as a resistor trimming circuit, in order that resistance values of a polysilicon resistance and the like incorporated in the wafer process can be adjusted in the subsequent process. Among others, a laser trimming fuse is configured such that a desired fuse element can be separated using a laser beam, which is a technique used for a semiconductor integrated circuit requiring a large number of fuses.

A vertically-structured power device (for example, an IGBT (Insulated Gate Bipolar Transistor)) serves to sense the temperature information of a power device based on the VF characteristics of the temperature sensing diode incorporated in the power device, thereby performing a function of protecting the IGBT element from heating (a heating protection function). The temperature sensing diode formed of a power device cannot however be formed on an Si substrate, and therefore, is formed of a polysilicon layer on an oxide film formed on the Si substrate. This leads to problems that VF characteristics greatly vary, so that the temperature cannot be sensed with high accuracy.

The present invention provides a function of correcting such variations in temperature sensing diode characteristics, thereby improving the temperature sensing accuracy. For this purpose, for example, a trimming element for sensing the information on the temperature sensing diode is provided, for which various methods such as a trimming method by laser cutting are proposed.

SUMMARY OF THE INVENTION

In the trimming method implemented by laser cutting in the normal semiconductor integrated circuit process, a high power laser beam is used for reliably laser-cutting a fuse in a short time period. Thus, when the laser beam is too strong, its heat may cause an adverse effect on the semiconductor substrate located below the fuse.

Other objects and new characteristics will become apparent from the description in the present specification and the illustrations in the accompanying drawings.

According to one embodiment, a semiconductor device includes: a semiconductor substrate having a main surface; a first insulating film formed in a convex shape and provided on the main surface of the semiconductor substrate; a first diffusion layer formed on the semiconductor substrate and provided to surround the first insulating film formed in a convex shape, the first diffusion layer being different in conductivity type from the semiconductor substrate; a first conductive layer formed so as to extend across the first insulating film formed in a convex shape, the first conductive layer forming a fuse element; and a second insulating film provided on the first conductive layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit configuration diagram of a semiconductor device 1 according to the first embodiment.

FIG. 2 is a diagram illustrating the layout configuration of semiconductor device 1 according to the first embodiment.

DESCRIPTION OF THE PREFERRED EMBODIMENTS

Figures 3A, 3B:
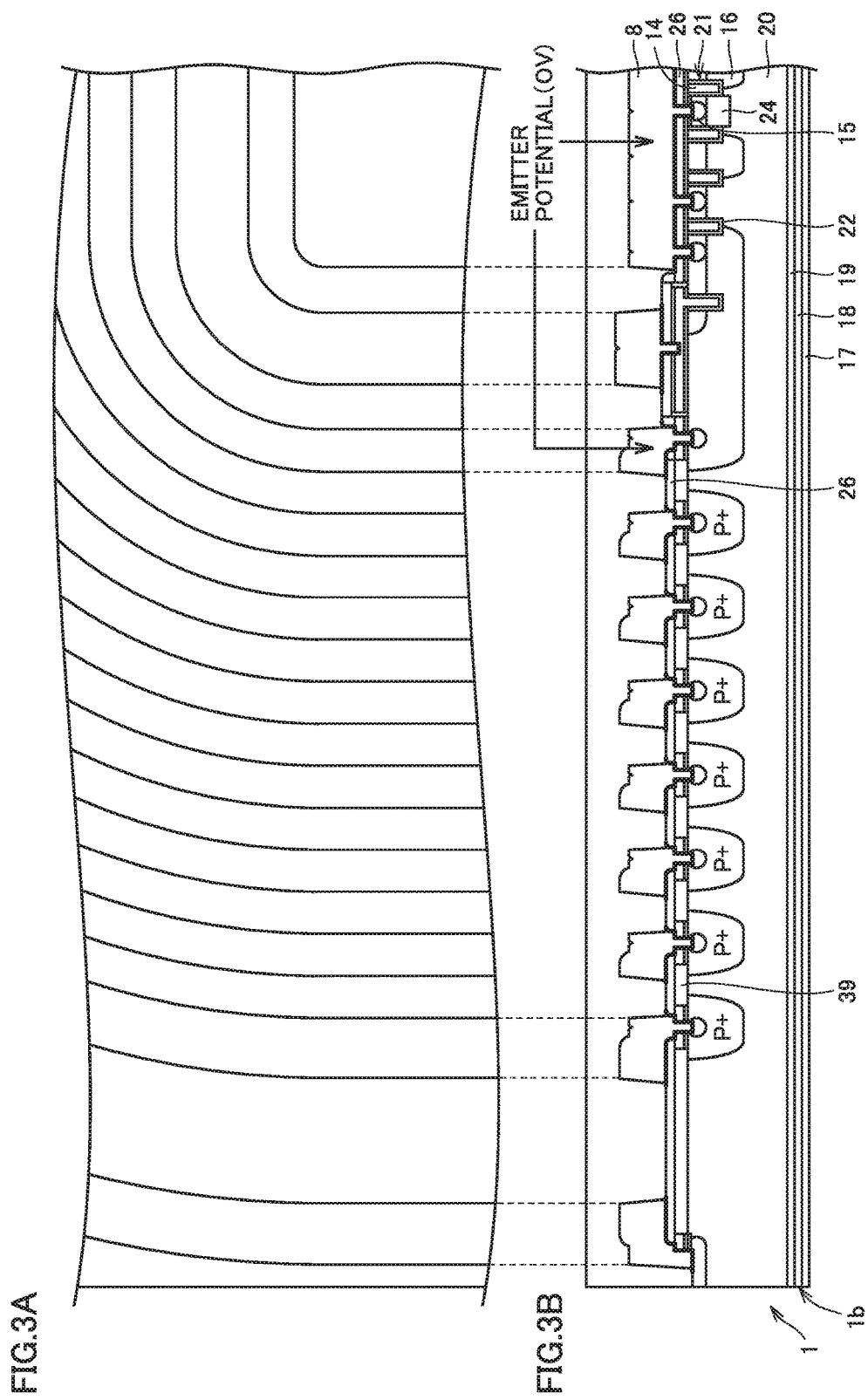
FIGS. 3A and 3B are diagrams each illustrating a termination structure according to the first embodiment.

Embodiments will be hereinafter described in detail with reference to the accompanying drawings, in which the same or corresponding components are designated the same reference characters, and description thereof will not be repeated.

First Embodiment

FIG. 1 is a circuit configuration diagram of a semiconductor device 1 according to the first embodiment.

As shown in FIG. 1, a semiconductor device 1 including an IGBT serving as a power device will be hereinafter described.

Semiconductor device 1 includes a semiconductor chip in which an IGBT 2, a temperature sensing diode DI, a false portion 5, and a plurality of pads are arranged.

IGBT 2 has a gate connected to a pad G, and a collector and an emitter connected to a pad C and a pad E, respectively.

Temperature sensing diode DI has an anode side and a cathode side connected to a pad AP and a pad KP, respectively.

Fuse portion 5 includes fuse elements F1 to F3 that can be trimmed by laser cutting (which is also referred to as laser trimming).

Fuse element F1 is connected to each of pads I1 and O1.
Fuse element F2 is connected to each of pads I2 and O2.
Fuse element F3 is connected to each of pads I3 and O3.

As will be described later, fuse elements F1 to F3 are connected to non-trimming elements, respectively, each formed of a resistor. Fuse elements F1 to F3 are cut by laser trimming, thereby adjusting the resistance value of each non-trimming element between the pads. The information on the adjusted resistance value is used as information for adjusting each of various power devices (for example, information of the temperature sensing diode).

A diode for gate protection is provided around pad G, which will be described later.

FIG. 2 is a diagram illustrating the layout configuration of semiconductor device 1 according to the first embodiment.

As shown in FIG. 2, the semiconductor chip has an outer peripheral region, in which a cell peripheral junction region is arranged, around which a field plate, a floating field ring and the like are further arranged, thereby forming a termination structure.

The floating field ring used herein (which is also referred to as a "field limiting ring") is as described below. Specifically, the floating field ring is provided on the surface of the drift region (device surface) separately from a P type body region (P type well region). Also, the floating field ring and the P type body region are identical in conductivity type and similar in concentration (concentration at which depletion is not completely achieved when a reverse voltage is applied to a main junction). Furthermore, the floating field ring serves as an impurity region or an impurity region group that annularly surrounds a cell region in a single layer or in a plurality of layers.

A plurality of IGBT cells are repeatedly arranged inside the semiconductor chip. Also, adjacent to these IGBT cells, a protective diode DI, a fuse portion 5, a plurality of pads (G, C, E, I1 to I3, O1 to O3, AP, KP), and the like are arranged.

FIGS. 3A and 3B are diagrams each illustrating a termination structure according to the first embodiment.

As shown in FIGS. 3A and 3B, the semiconductor chip has an outer peripheral region in which a cell peripheral junction region is provided, around which a field plate, a floating field ring and the like are annually arranged.

An annular-shaped P type cell peripheral junction region is provided in the outer peripheral portion of the cell region in the IGBT so as to surround this outer peripheral portion. On the surface of the cell peripheral junction region, floating P type diffusion layers are arranged periodically at intervals in an N−πtype drift region 20, thereby alleviating the electric field strength in the N− type drift region.

This P type diffusion layer is connected to an aluminum-based electrode film 8 with a P+ type body contact region interposed therebetween. This aluminum-based electrode film 8 functions as a metal field plate, so that the electric field strength on the surface of the N− type drift region can be alleviated and a withstand voltage can be maintained.

The chip has a back surface 1b (the back-side main surface or the second main surface of the semiconductor substrate) including a semiconductor region (a silicon single crystal region in this example) having a P+ type collector region 18 provided therein. On the surface of this P+ type collector region 18, a metal collector electrode 17 is provided. An N type buffer region 19 (a buffer region having the first conductivity type) higher in concentration than N− type drift region 20 is provided between N− type drift region 20 (a drift region having the first conductivity type) forming a main part of the semiconductor substrate and P+ type collector region 18 (a collector region having the second conductivity type). In other words, N type buffer region 19 is provided in N− type drift region 20 located on the inside of P+ type collector region 18 so as to be in contact with this P+ type collector region 18.

A large number of trenches 21 are provided in a semiconductor region of N− type drift region 20 that is located close to a surface 1a (the front-side main surface or the first main surface of the semiconductor substrate). A trench gate electrode 14 is embedded within each of trenches 21 with a gate insulating film interposed therebetween.

Furthermore, these trenches 21 serve to partition a region into a plurality of regions. Each of the regions is partitioned on both sides thereof by a pair of trenches 21. The cell region and the cell peripheral junction region are partitioned by one of these trenches 21. This cell peripheral junction region is connected to aluminum-based electrode film 8 with P+ type body contact region interposed therebetween.

Figure 4A:
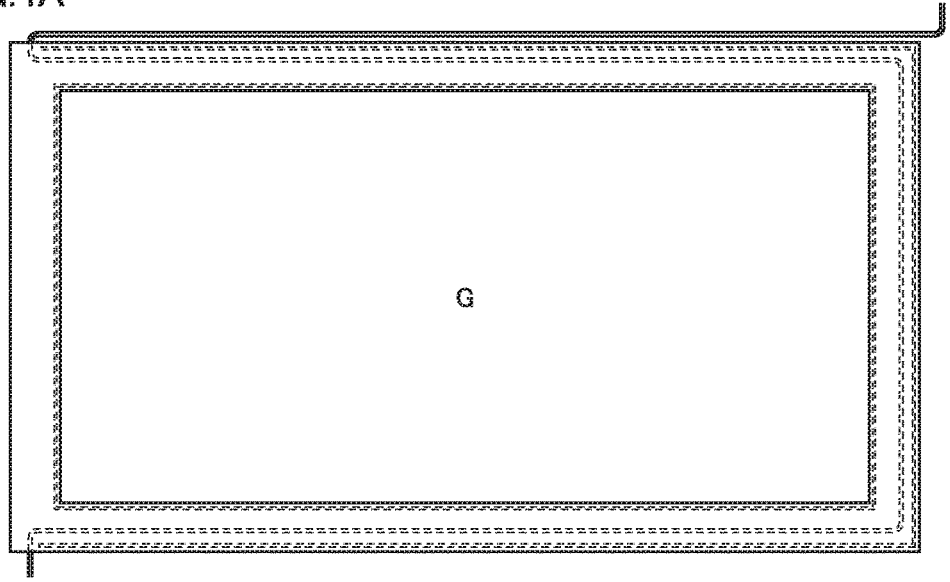
FIGS. 4A and 4B are diagrams each illustrating a diode for gate protection according to the first embodiment.
Figure 4B:
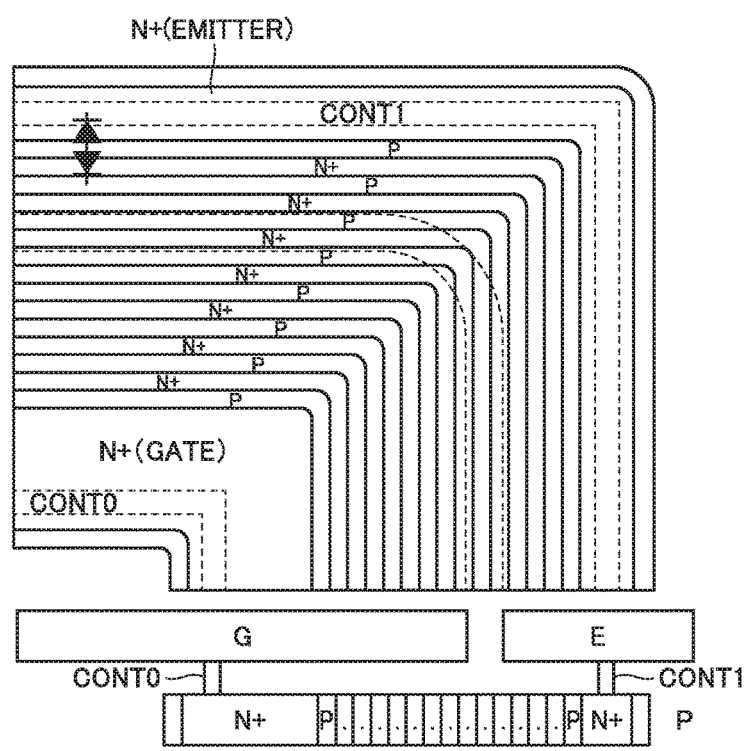

FIGS. 4A and 4B are diagrams each illustrating a diode for gate protection according to the first embodiment.

As shown in FIG. 4A, the diode for gate protection is arranged in a peripheral region of pad G connected to the gate of the IGBT.

As shown in FIG. 4B, the diode for gate protection is arranged so as to be connected in series and bi-directionally between pad G of the gate electrode and pad E of the emitter electrode. FIG. 5 is a diagram illustrating a fuse element according to the first embodiment.

Figure 5C:
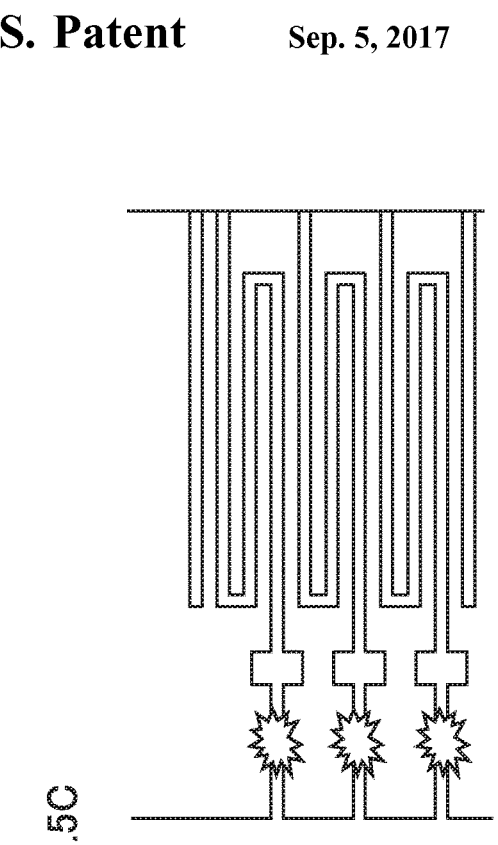
FIGS. 5A to 5C are diagrams each illustrating a fuse element according to the first embodiment.
Figure 5A:
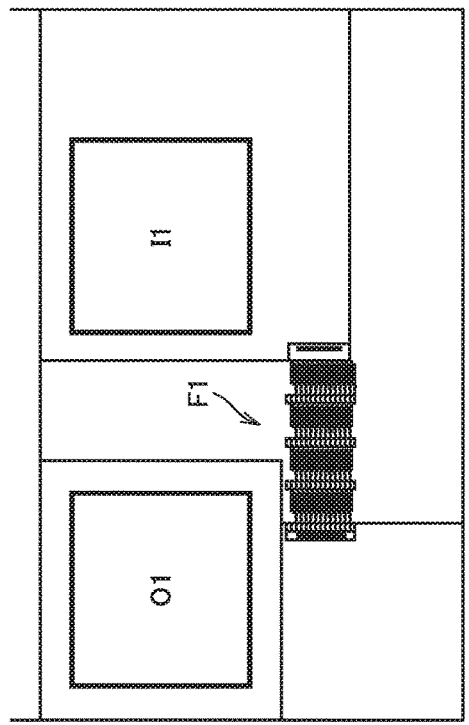
Figure 5B:
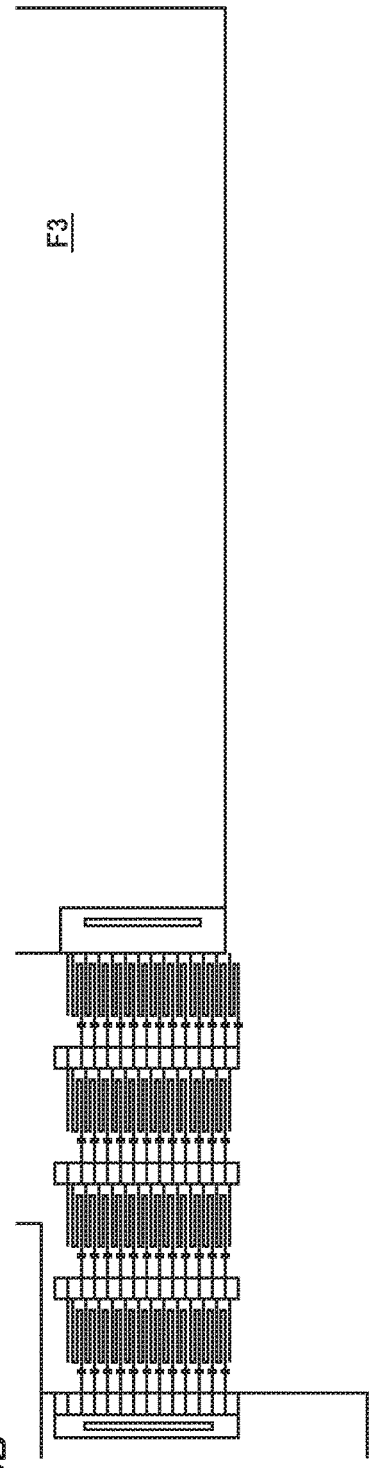

FIGS. 5A to 5C are diagrams each illustrating a fuse element according to the first embodiment.

As shown in FIG. 5A, fuse element F1 is provided between pads I1 and O1.

Fuse element F1 is formed of a plurality of fuse element units arranged in series and in a plurality of stages, as shown in FIG. 5B.

As shown in FIG. 5C, the current path of each fuse element unit is laser-cut by laser trimming, thereby changing the current path, so that the resistance value is adjusted.

Figure 6B:
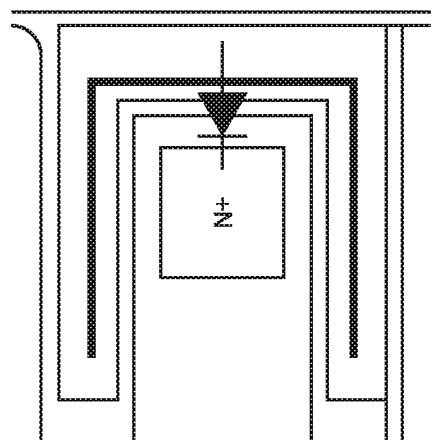
FIGS. 6A and 6B are diagrams each illustrating a temperature sensing diode according to the first embodiment.
Figure 6A:
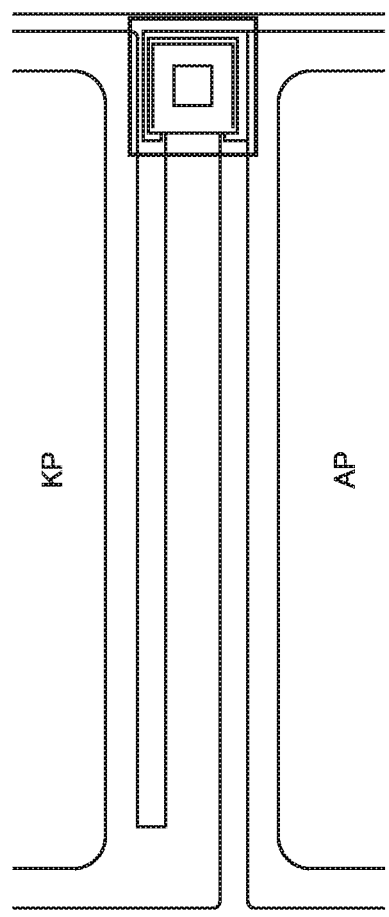

FIGS. 6A and 6B are diagrams each illustrating a temperature sensing diode according to the first embodiment.

As shown in FIG. 6A, temperature sensing diode DI is provided between pads KP and AP.

As shown in FIG. 6B, an N+ diffusion layer and a P+ diffusion layer surrounding this N+ diffusion layer are arranged.

Figure 7:
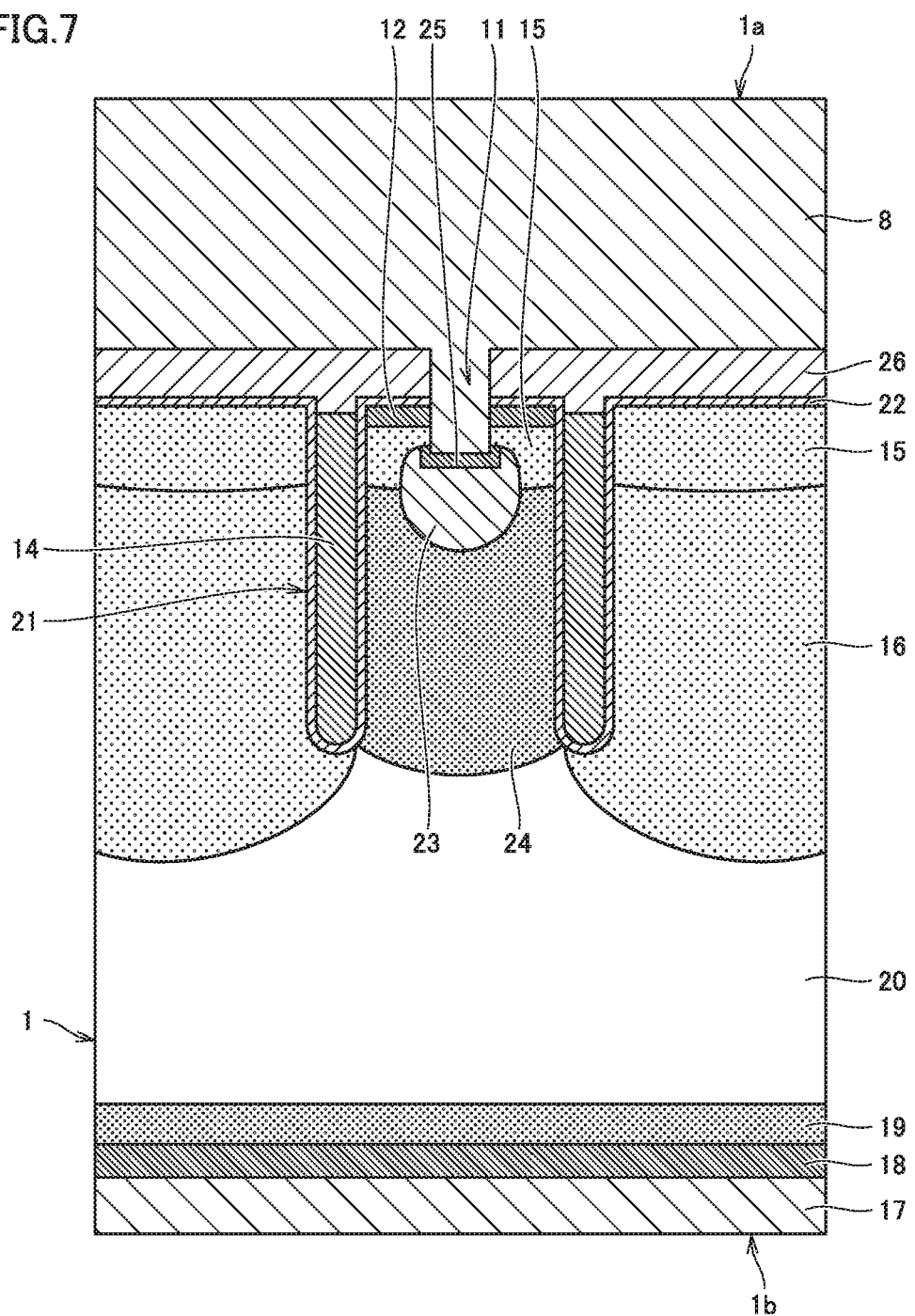
FIG. 7 is a diagram illustrating an IGBT cell according to the first embodiment.

FIG. 7 is a diagram illustrating an IGBT cell according to the first embodiment.

As shown in FIG. 7, P+ type collector region 18, N type buffer region 19 and the like are formed in the semiconductor region on back surface 1b of the semiconductor chip so as to be arranged one above the other and in contact with each other. Metal collector electrode 17 is formed on back surface 1b of semiconductor chip 2. Specifically, N type buffer region 19 is provided in N− type drift region 20 located on the inside of P+ type collector region 18 so as to be in contact with this P+ type collector region 18, as having been described above.

An N type hole barrier region 24 (a hole barrier region having the first conductivity type), a P type body region 15, and an N+ type emitter region 12 provided sequentially from the bottom in N− type drift region 20 (the semiconductor region of the semiconductor substrate located close to the surface side) of the semiconductor chip that is located close to surface 1a (the first main surface). Furthermore, an interlayer insulating film 26 is formed on surface 1a of semiconductor chip 2. A contact groove 11 (or a contact hole) extending through the inside of the semiconductor substrate is provided corresponding to this interlayer insulating film 26. Also, a P+ type body contact region 25 and a P+ type latch-up preventing region 23 are provided sequentially from the top in the semiconductor region located at the bottom of this contact groove 11 and the like. P type body region 15 and N+ type emitter region 12 are connected through this contact groove 11 and the like to aluminum-based electrode film 8 provided on interlayer insulating film 26.

In this case, N type hole barrier region 24 serves as a barrier region for preventing holes from flowing from N− type drift region 20 into a passage leading to N+ type emitter region 12. This N type hole barrier region 24 is lower in impurity concentration than N+ type emitter region 12 and higher in impurity concentration than N− type drift region 20.

Also, a P type floating region 16 and a P type body region 15 are provided sequentially from the bottom in N− type drift region 20 (a semiconductor region of the semiconductor substrate located close to the surface in semiconductor chip 2 located close to surface 1a (the first main surface). P type floating region 16 is formed to have a depth deeper than the depth of trench 21, and extends so as to cover the lower end portion of trench 21.

<Process of Manufacturing IGBT Cell>

Figure 8:
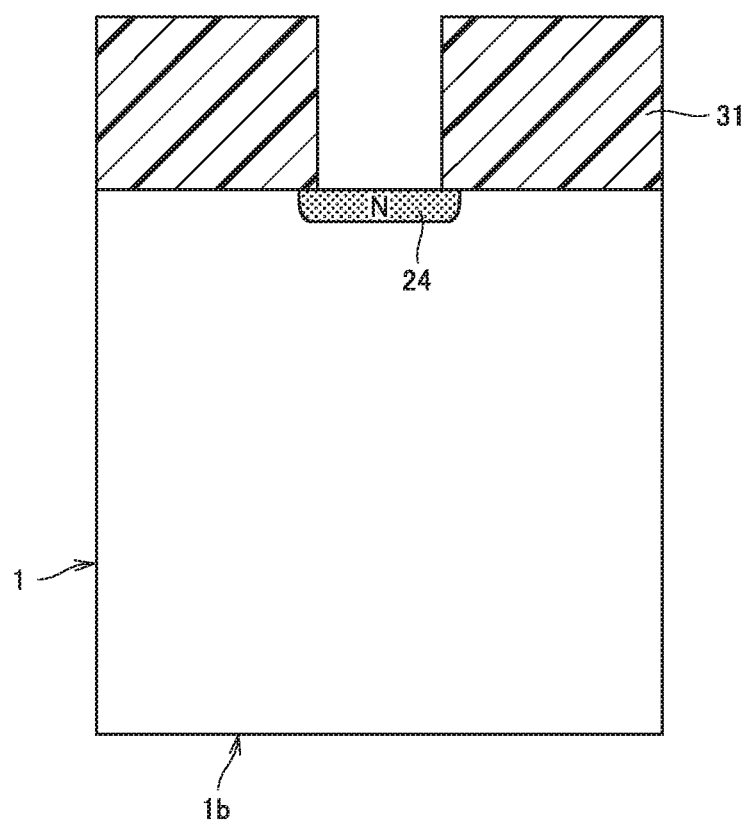
FIG. 8 is a schematic cross-sectional view showing the first step of a method of manufacturing a semiconductor device according to the first embodiment.

FIG. 8 is a schematic cross-sectional view showing the first step of a method of manufacturing a semiconductor device according to the first embodiment.

As shown in FIG. 8, an N type hole barrier region introducing resist film 31 is formed by coating or the like on almost the entire surface 1a (the first main surface) of the semiconductor wafer made of an N− type silicon single crystal, and patterned by normal lithography. The patterned N type hole barrier region introducing resist film 31 is used as a mask to introduce N type impurities, for example, by ion implantation into the semiconductor substrate (N− type single crystal silicon substrate) of the semiconductor wafer located close to surface 1a (the first main surface), thereby forming an N type hole barrier region 24. Examples of ion implantation conditions suitably used in this case may be as follows. Specifically, ion species: phosphorus, dose amount: about $6\times10^{12}/cm^2$, and implantation energy: about 80 KeV. Then, unnecessary resist film 31 is removed by ashing or the like.

Figure 9:
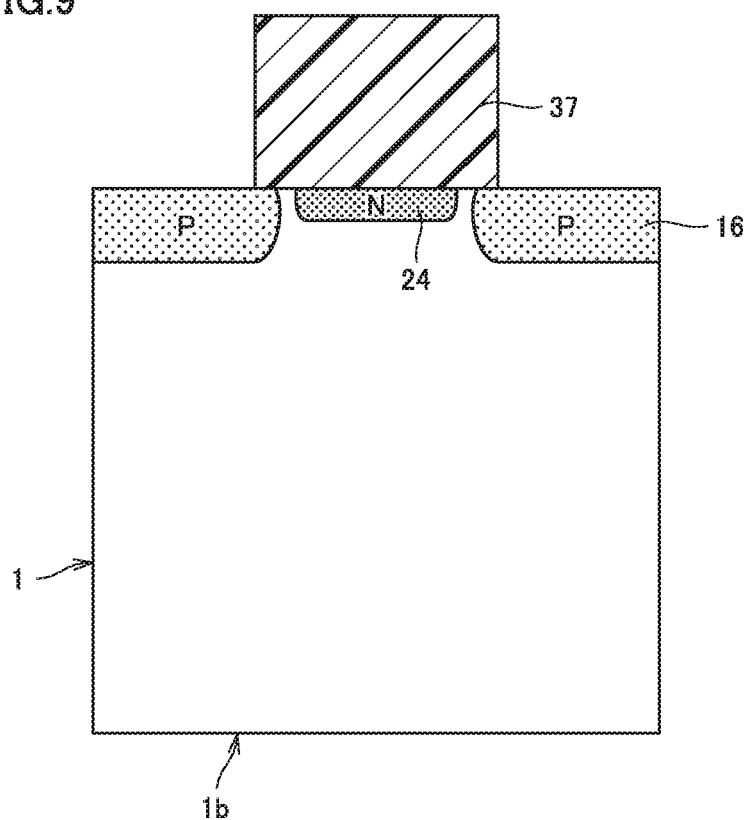
FIG. 9 is a schematic cross-sectional view showing the second step of the method of manufacturing a semiconductor device according to the first embodiment.

FIG. 9 is a schematic cross-sectional view showing the second step of the method of manufacturing a semiconductor device according to the first embodiment.

As shown in FIG. 9, P type floating region introducing resist film 37 is formed by coating or the like on almost the entire surface 1a of the semiconductor wafer, and patterned by normal lithography. The patterned P type floating region introducing resist film 37 is used as a mask to introduce P type impurities, for example, by ion implantation into the semiconductor substrate of the semiconductor wafer located close to surface 1a (the first main surface), thereby forming a P type floating region 16. Examples of ion implantation conditions suitably used in this case may be as follows. Specifically, ion species: boron, dose amount: about $3.5\times10^{13}/cm^2$, and implantation energy: about 75 KeV. Then, unnecessary resist film 37 is removed by ashing or the like. In addition, a cell peripheral junction region in FIG. 3 is also simultaneously introduced during introduction of P type floating region 16.

Figure 10:
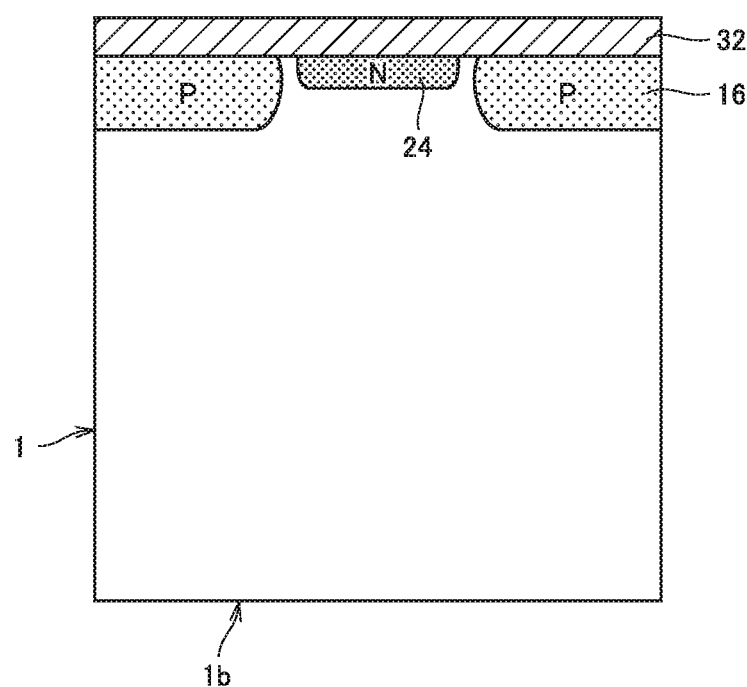
FIG. 10 is a schematic cross-sectional view showing the third step of the method of manufacturing a semiconductor device according to the first embodiment.

FIG. 10 is a schematic cross-sectional view showing the third step of the method of manufacturing a semiconductor device according to the first embodiment.

As shown in FIG. 10, a trench forming hard mask film 32 (for example, having a thickness of about 450 nm) such as a silicon oxide-based insulating film is formed on almost the entire surface 1a of the semiconductor wafer, for example, by CVD (Chemical Vapor Deposition) or the like.

Figure 11:
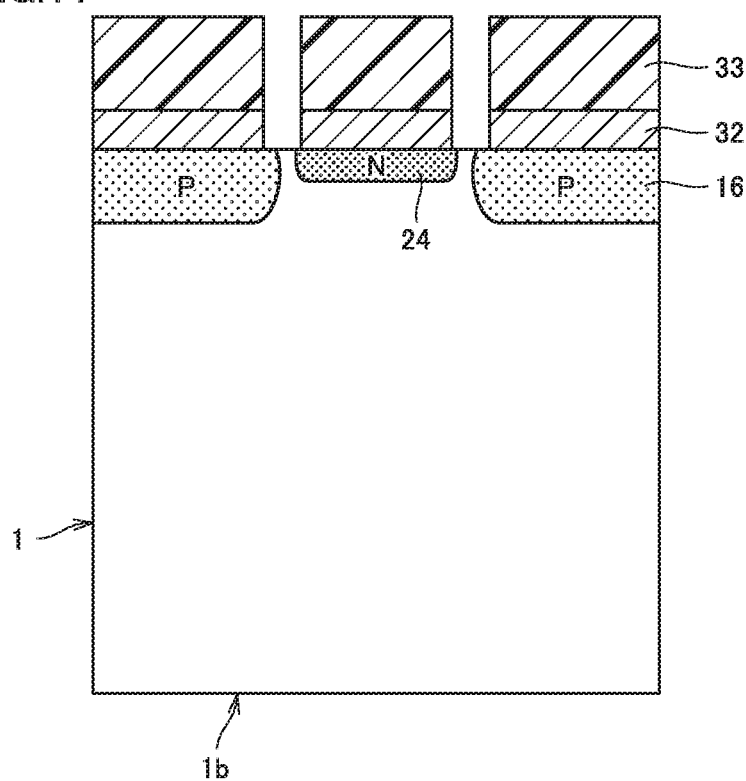
FIG. 11 is a schematic cross-sectional view showing the fourth step of the method of manufacturing a semiconductor device according to the first embodiment.

FIG. 11 is a schematic cross-sectional view showing the fourth step of the method of manufacturing a semiconductor device according to the first embodiment.

As shown in FIG. 11, a trench hard mask film processing resist film 33 is formed by coating or the like on almost the entire surface 1a of the semiconductor wafer, and patterned by normal lithography. The patterned trench hard mask film processing resist film 33 is used as a mask to pattern a trench forming hard mask film 32, for example, dry etching.

Figure 12:
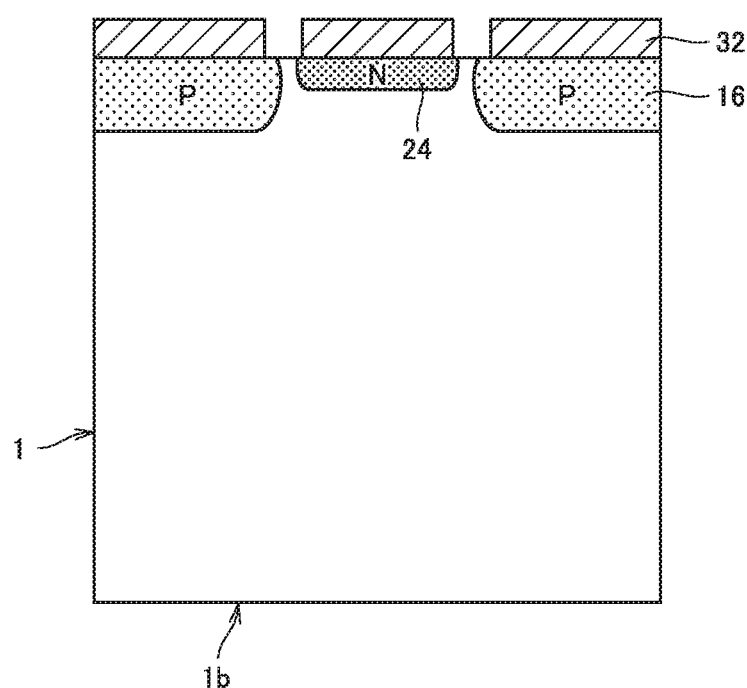
FIG. 12 is a schematic cross-sectional view showing the fifth step of the method of manufacturing a semiconductor device according to the first embodiment.

FIG. 12 is a schematic cross-sectional view showing the fifth step of the method of manufacturing a semiconductor device according to the first embodiment.

As shown in FIG. 12, unnecessary resist film 33 is removed by ashing or the like.

Figure 13:
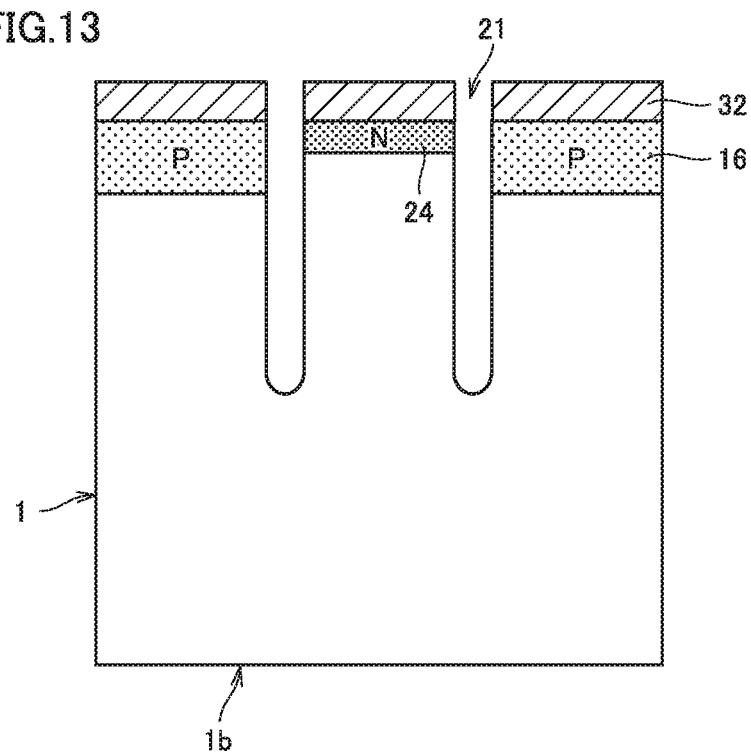
FIG. 13 is a schematic cross-sectional view showing the sixth step of the method of manufacturing a semiconductor device according to the first embodiment.

FIG. 13 is a schematic cross-sectional view showing the sixth step of the method of manufacturing a semiconductor device according to the first embodiment.

As shown in FIG. 13, a trench 21 is formed, for example, by anisotropic dry etching using the patterned trench forming hard mask film 32. Examples of gas types suitably used in this anisotropic dry etching may be Cl2/O2-based gas.

Figure 14:
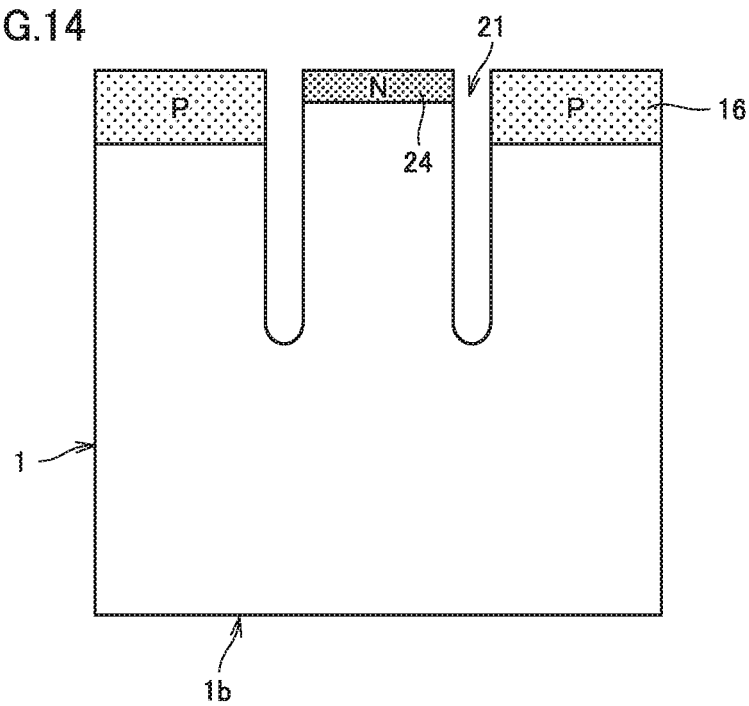
FIG. 14 is a schematic cross-sectional view showing the seventh step of the method of manufacturing a semiconductor device according to the first embodiment.

FIG. 14 is a schematic cross-sectional view showing the seventh step of the method of manufacturing a semiconductor device according to the first embodiment.

As shown in FIG. 14, unnecessary trench forming hard mask film 32 is removed, for example, by wet etching using a hydrofluoric acid-based silicon oxide film etching solution, and the like.

Figure 15:
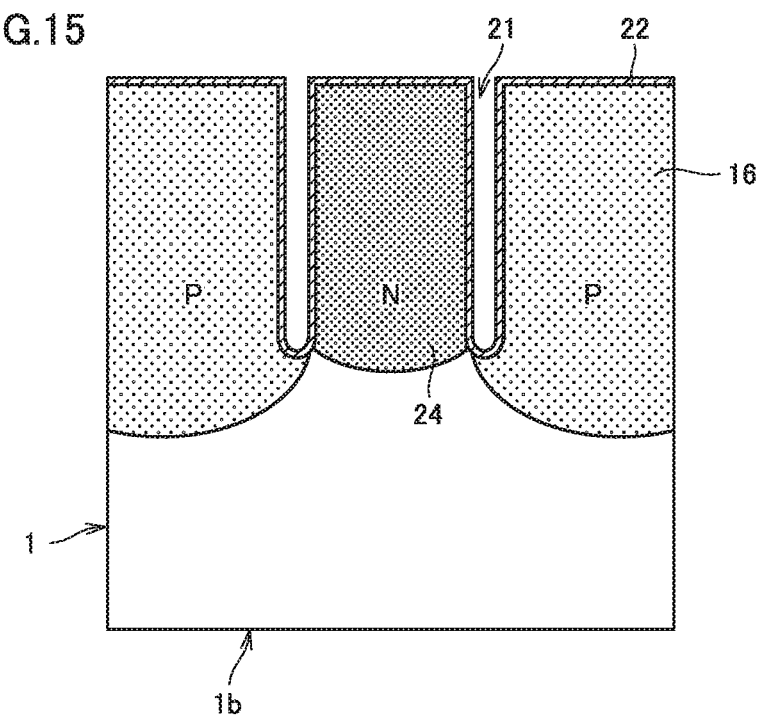
FIG. 15 is a schematic cross-sectional view showing the eighth step of the method of manufacturing a semiconductor device according to the first embodiment.

FIG. 15 is a schematic cross-sectional view showing the eighth step of the method of manufacturing a semiconductor device according to the first embodiment.

As shown in FIG. 15, P type floating region 16 and N type hole barrier region 24 are stretched so as to be diffused (for example, at 1200 degrees centigrade for about 30 minutes). Then, gate insulating film 22 (for example, having a thickness of about 120 nm) is formed, for example, by thermal oxidation or the like on surface 1a of the semiconductor wafer and on almost the entire inner surface of trench 21.

Figure 16:
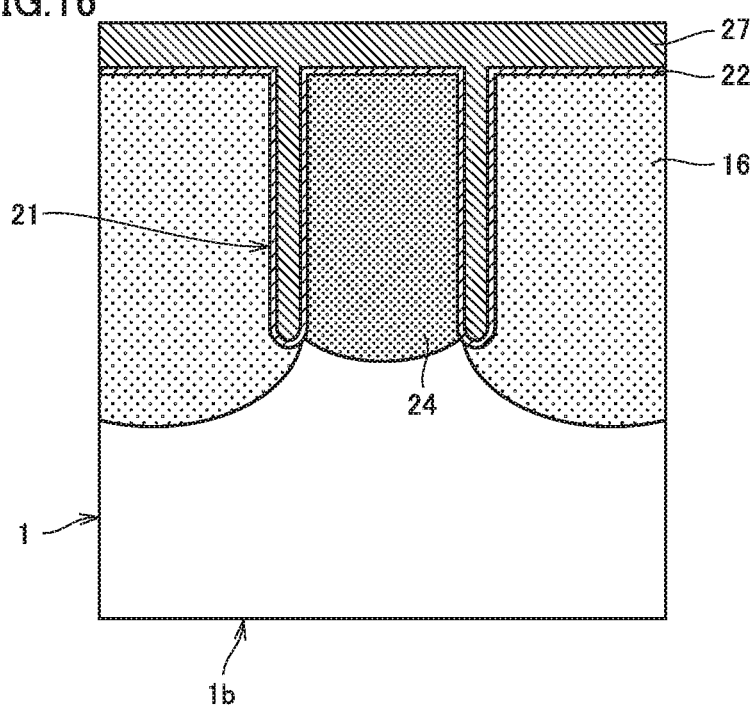
FIG. 16 is a schematic cross-sectional view showing the ninth step of the method of manufacturing a semiconductor device according to the first embodiment.

FIG. 16 is a schematic cross-sectional view showing the ninth step of the method of manufacturing a semiconductor device according to the first embodiment.

As shown in FIG. 16, a doped poly-silicon film 27 into which phosphorus is doped is formed (for example, to have a thickness of about 600 nm), for example, by CVD or the like on areas of gate insulating film 22 and almost the entire inner surface of trench 21, in such a manner that trench 21 is filled with the film 27.

Figure 17:
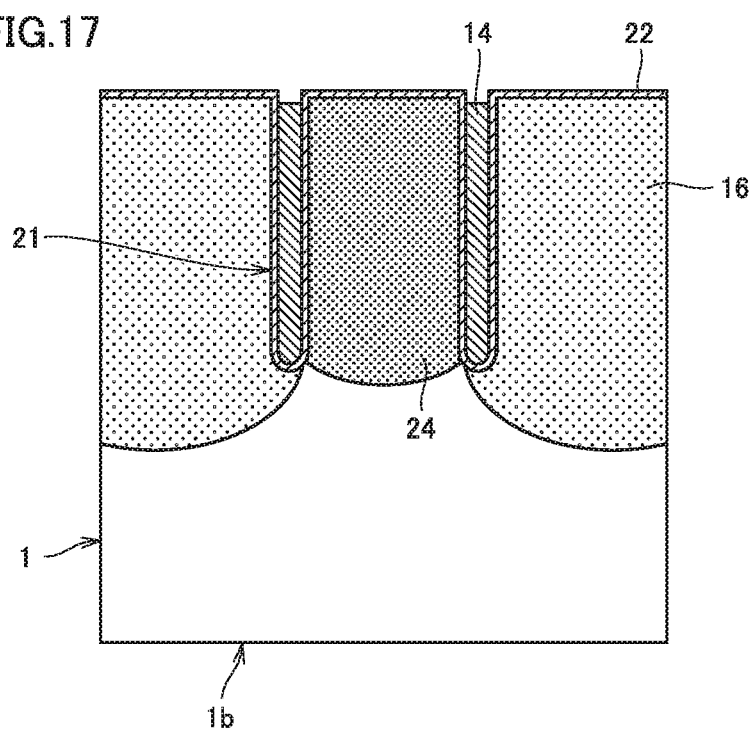
FIG. 17 is a schematic cross-sectional view showing the tenth step of the method of manufacturing a semiconductor device according to the first embodiment.

FIG. 17 is a schematic cross-sectional view showing the tenth step of the method of manufacturing a semiconductor device according to the first embodiment.

As shown in FIG. 17, trench gate electrode 14 is formed inside trench 21 by etching-back a polysilicon film 27, for example, by dry etching or the like (for example, using SF6 and the like as a gas type).

Figure 18:
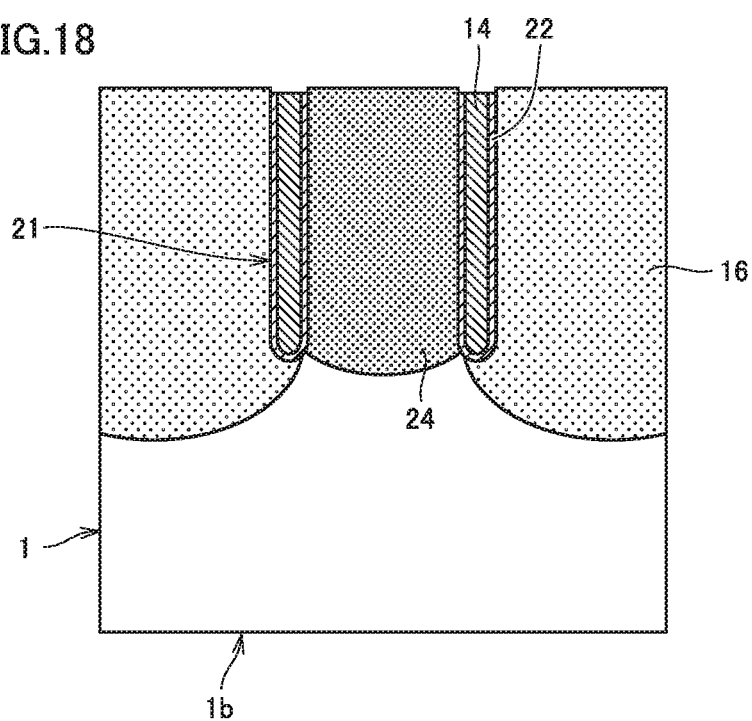
FIG. 18 is a schematic cross-sectional view showing the eleventh step of the method of manufacturing a semiconductor device according to the first embodiment.

FIG. 18 is a schematic cross-sectional view showing the eleventh step of the method of manufacturing a semiconductor device according to the first embodiment.

As shown in FIG. 18, gate insulating film 22 formed on the outside of trench 21 is removed, for example, by wet etching using a hydrofluoric acid-based silicon oxide film etching solution and the like.

Figure 19:
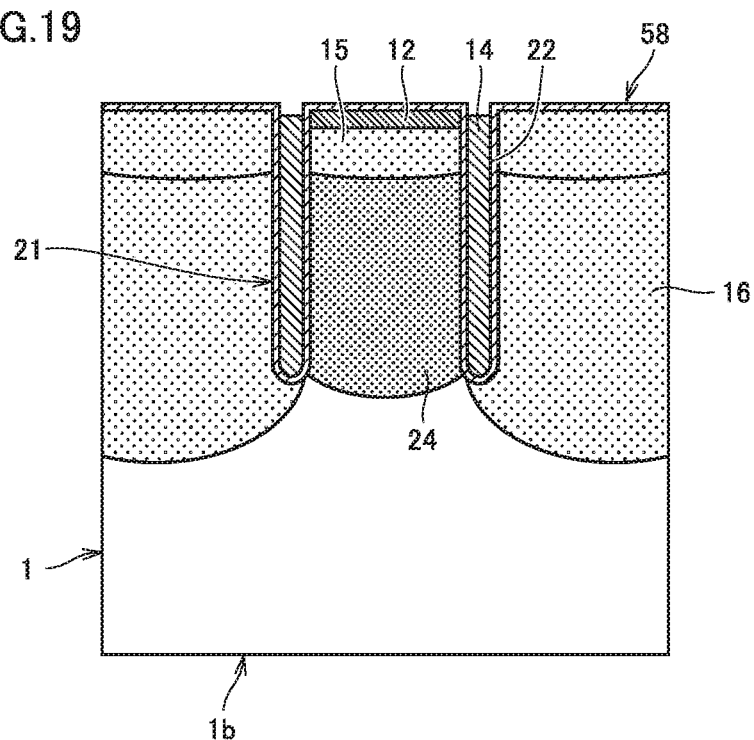
FIG. 19 is a schematic cross-sectional view showing the twelfth step of the method of manufacturing a semiconductor device according to the first embodiment.

FIG. 19 is a schematic cross-sectional view showing the twelfth step of the method of manufacturing a semiconductor device according to the first embodiment.

As shown in FIG. 19, a relatively thin silicon oxide film 58 for the subsequent ion implantation is formed on almost the entire surface 1a of the semiconductor wafer, for example, by thermal oxidation or CVD.

Then, a P type body region introducing resist film is formed on surface 1a of the semiconductor wafer by normal lithography. This P type body region introducing resist film is used as a mask to introduce P type impurities, for example, by ion implantation into almost the entire surface and other desired portions in the cell region, thereby forming a P type body region 15. Examples of ion implantation conditions suitably used in this case may be as follows. Specifically, ion species: boron, dose amount: about $2\times10^{13}/cm^2$, and implantation energy: about 75 KeV. Then, unnecessary P type body region introducing resist film is removed by ashing or the like.

Furthermore, an N+ type emitter region introducing resist film is formed on surface 1a of the semiconductor wafer by normal lithography. This N+ type emitter region introducing resist film is used as a mask to introduce N type impurities, for example, by ion implantation into almost the entire upper surface of P type body region 15, thereby forming an N+ type emitter region 12. Examples of ion implantation conditions suitably used in this case may be as follows. Specifically, ion species: arsenic, dose amount: about $5\times10^{15}/cm^2$, and implantation energy: about 80 KeV. Then, an unnecessary N+ type emitter region introducing resist film is removed by ashing or the like.

Figure 20:
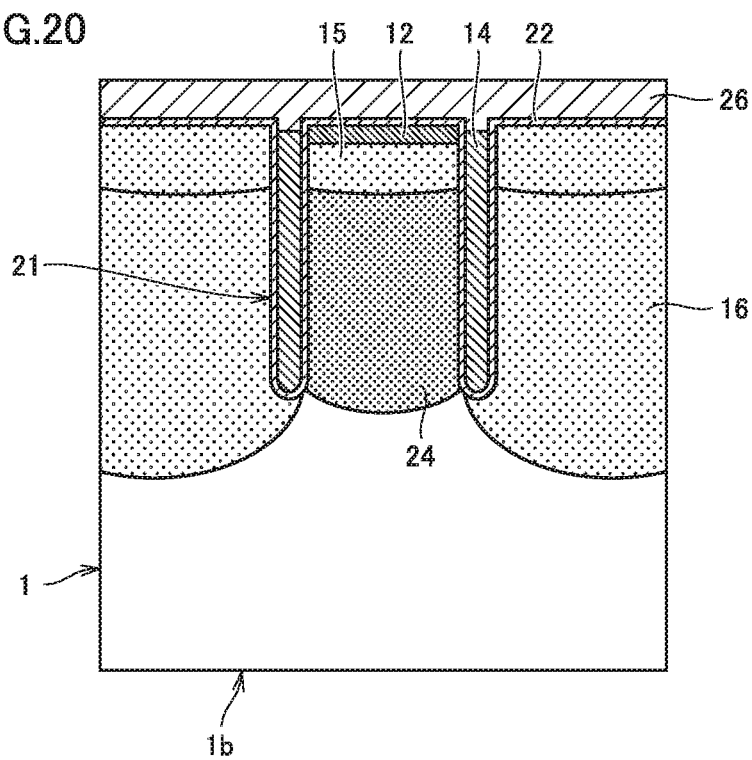
FIG. 20 is a schematic cross-sectional view showing the thirteenth step of the method of manufacturing a semiconductor device according to the first embodiment.

FIG. 20 is a schematic cross-sectional view showing the thirteenth step of the method of manufacturing a semiconductor device according to the first embodiment.

As shown in FIG. 20, for example, a PSG (Phospho Silicate Glass) film is formed as interlayer insulating film 26 (for example, having a thickness of about 600 nm), for example, by CVD or the like on almost the entire surface 1a of the semiconductor wafer. In addition to a PSG film, this interlayer insulating film 26 can be suitably made, for example, of a BPSG (Boron Phospho Silicate Glass) film, an NSG (Non-doped Silicate Glass) film, an SOG (Spin-On-Glass) film, or a film made of a combination thereof.

Figure 21:
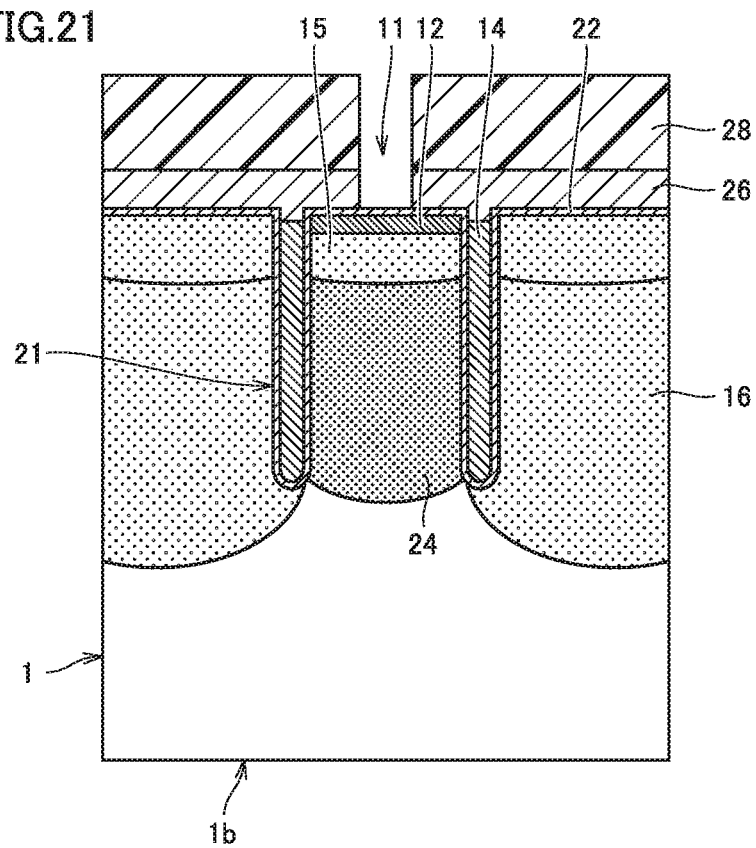
FIG. 21 is a schematic cross-sectional view showing the fourteenth step of the method of manufacturing a semiconductor device according to the first embodiment.

FIG. 21 is a schematic cross-sectional view showing the fourteenth step of the method of manufacturing a semiconductor device according to the first embodiment.

As shown in FIG. 21, a contact groove forming resist film 28 is formed by normal lithography on surface 1a of the semiconductor wafer on interlayer insulating film 26. Then, a contact groove 11 (or a contact hole) is provided, for example, by anisotropic dry etching or the like (for example, Ar/CHF3/CF4 and the like as a gas type).

Figure 22:
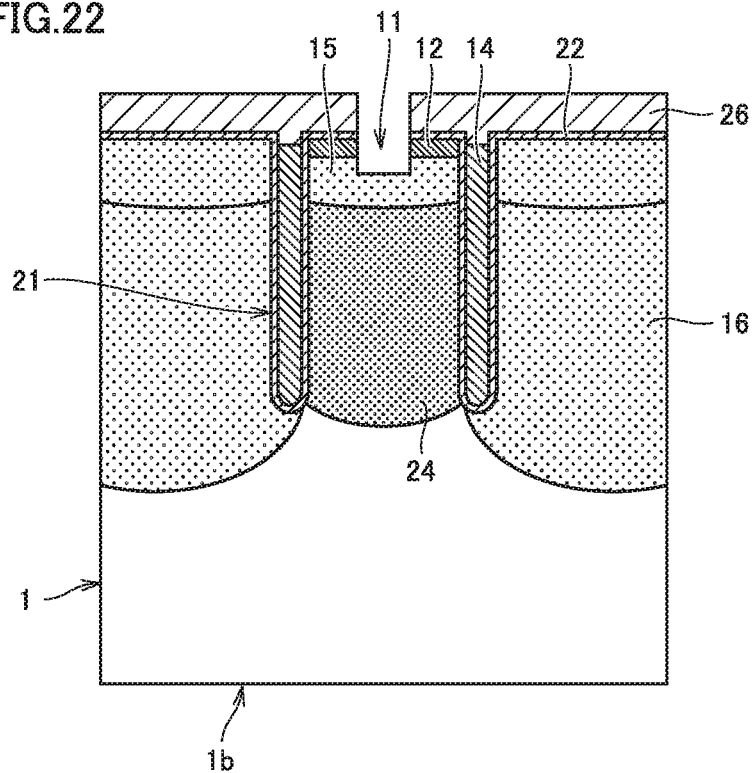
FIG. 22 is a schematic cross-sectional view showing the fifteenth step of the method of manufacturing a semiconductor device according to the first embodiment.

FIG. 22 is a schematic cross-sectional view showing the fifteenth step of the method of manufacturing a semiconductor device according to the first embodiment.

As shown in FIG. 22, unnecessary resist film 28 is removed by ashing or the like. Then, contact groove 11 (or a contact hole) is extended into the semiconductor substrate, for example, by anisotropic dry etching. Examples of gas types suitably used in this case may be Cl2/O2-based gas.

Figure 23:
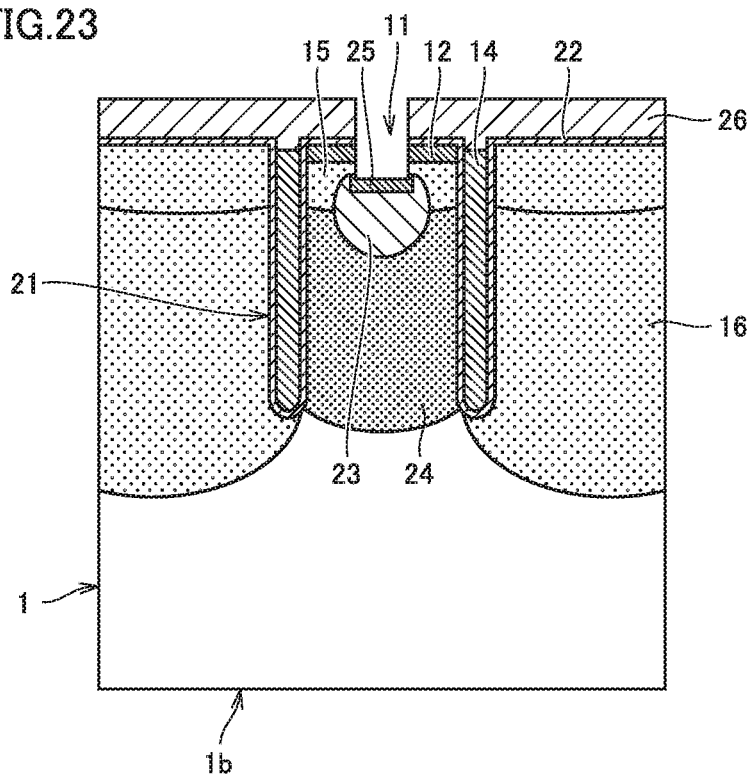
FIG. 23 is a schematic cross-sectional view showing the sixteenth step of the method of manufacturing a semiconductor device according to the first embodiment.

FIG. 23 is a schematic cross-sectional view showing the sixteenth step of the method of manufacturing a semiconductor device according to the first embodiment.

As shown in FIG. 23, P type impurities are ion-implanted, for example, through contact groove 11 to thereby form a P+ type body contact region 25. Examples of ion implantation conditions suitably used in this case may be as follows. Specifically, ion species: BF2, dose amount: about $5 \times 10^{15}/\text{cm}^2$, and implantation energy: about 80 KeV.

Similarly, P type impurities are ion-implanted, for example, through contact groove 11 to thereby form a P+ type latch-up preventing region 23. Examples of ion implantation conditions suitably used in this case may be as follows. Specifically, ion species: boron, dose amount: about $5 \times 10^{15}/\text{cm}^2$, and implantation energy: about 80 KeV.

Figure 24:
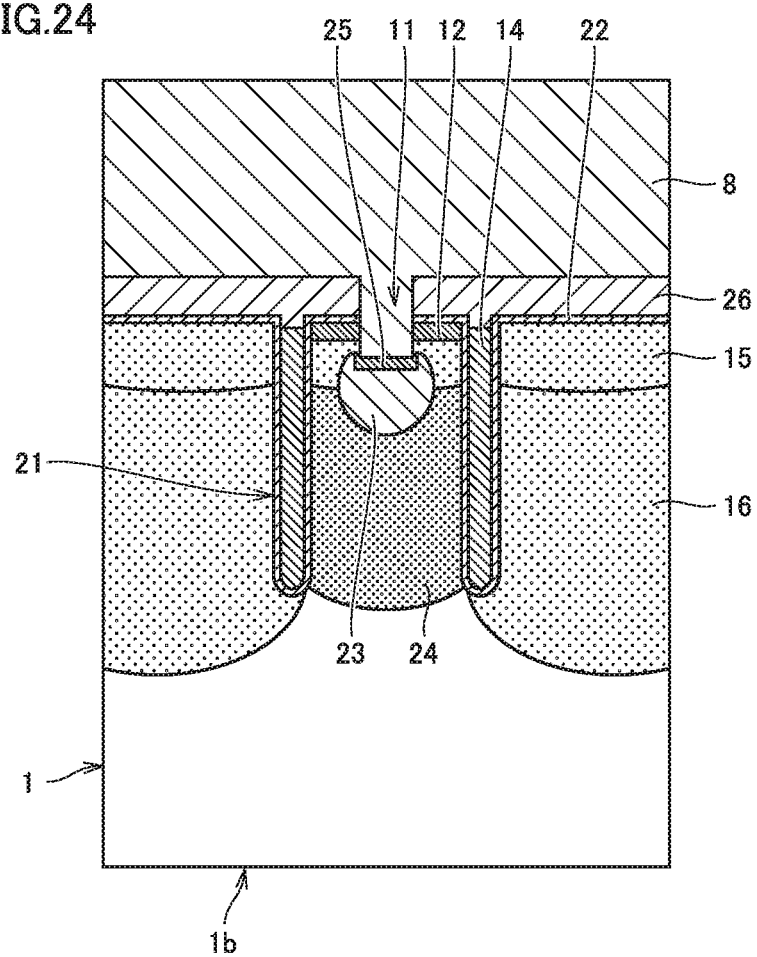
FIG. 24 is a schematic cross-sectional view showing the seventeenth step of the method of manufacturing a semiconductor device according to the first embodiment.

FIG. 24 is a schematic cross-sectional view showing the seventeenth step of the method of manufacturing a semiconductor device according to the first embodiment.

As shown in FIG. 24, an aluminum-based electrode film 8 (serving as a metal emitter electrode 8) is formed, for example, by sputtering or the like, which is specifically performed through the following procedure, for example. First, a TiW film (for example, having a thickness of about 200 nm) is formed as a barrier metal film on almost the entire surface 1a of the semiconductor wafer, for example, by sputtering film formation.

Then, silicide annealing is performed, for example, in a nitrogen atmosphere at about 600 degrees centigrade for about 10 minutes. Then, an aluminum-based metal film (for example, having a thickness of about 5 micrometers) containing aluminum as a main component (for example, additional several % of silicon and remnant of aluminum) is formed, for example, by sputtering film formation on almost the entire surface of the barrier metal film, in such a manner that contact groove 11 is filled with this aluminum-based metal film. Then, a metal emitter electrode 8 made of an aluminum-based metal film and a barrier metal film is patterned by normal lithography (for example, using Cl2/BCl3 and the like as a gas type for dry etching).

Thereby, the surface device forming process is completed, which is followed by a process for a back surface and the like (including a process related to the back surface-side structure and started at the front surface side).

Then, a back surface device forming process and the like for an IGBT cell according to the first embodiment will be hereinafter described.

Figure 25:
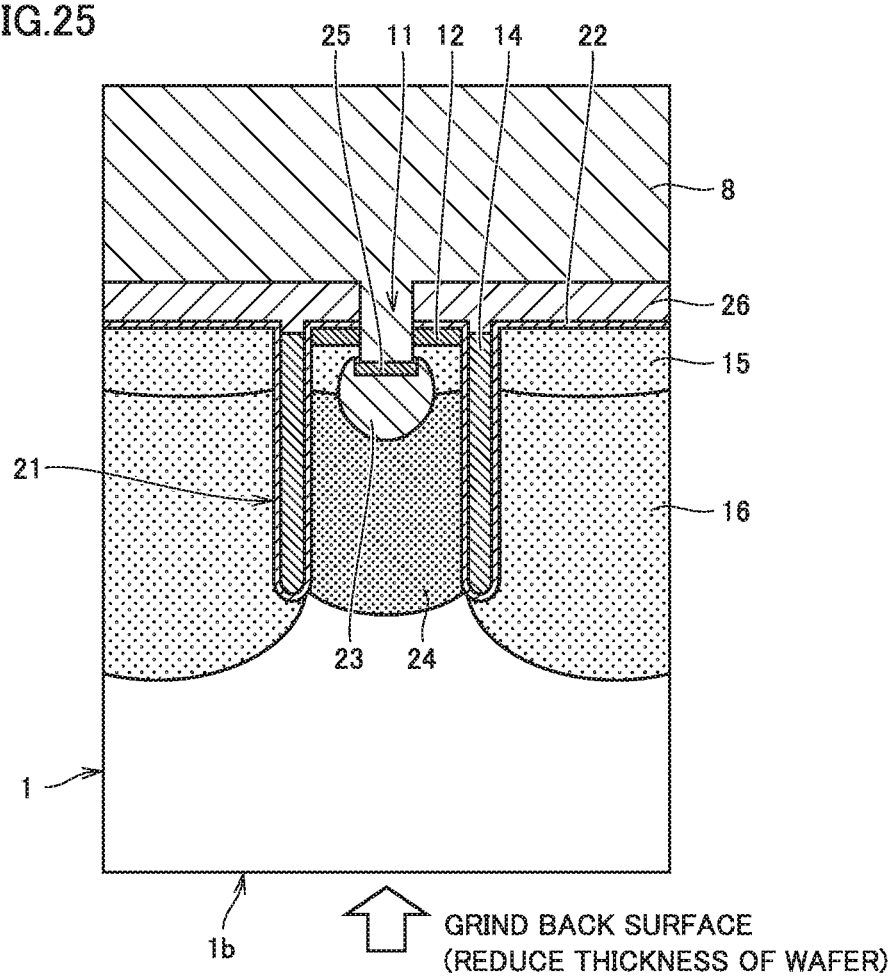
FIG. 25 is a schematic cross-sectional view showing the eighteenth step of the method of manufacturing a semiconductor device according to the first embodiment.

FIG. 25 is a schematic cross-sectional view showing the eighteenth step of the method of manufacturing a semiconductor device according to the first embodiment.

As shown in FIG. 25, the film is reduced in thickness by grinding or the like. In this case, the wafer is reduced in thickness from its original wafer thickness of about 800 micrometers (in a suitable range from about 1000 micrometers to about 450 micrometers), for example, to the final thickness of about 200 micrometers to 30 micrometers, as required. For example, assuming that the withstand voltage is approximately 600 volts, the final thickness is about 60 micrometers (its lower limit value is defined by the required withstand voltage, and the final thickness is about 120 micrometers, for example, at a withstand voltage of 1200 volts).

Figure 26:
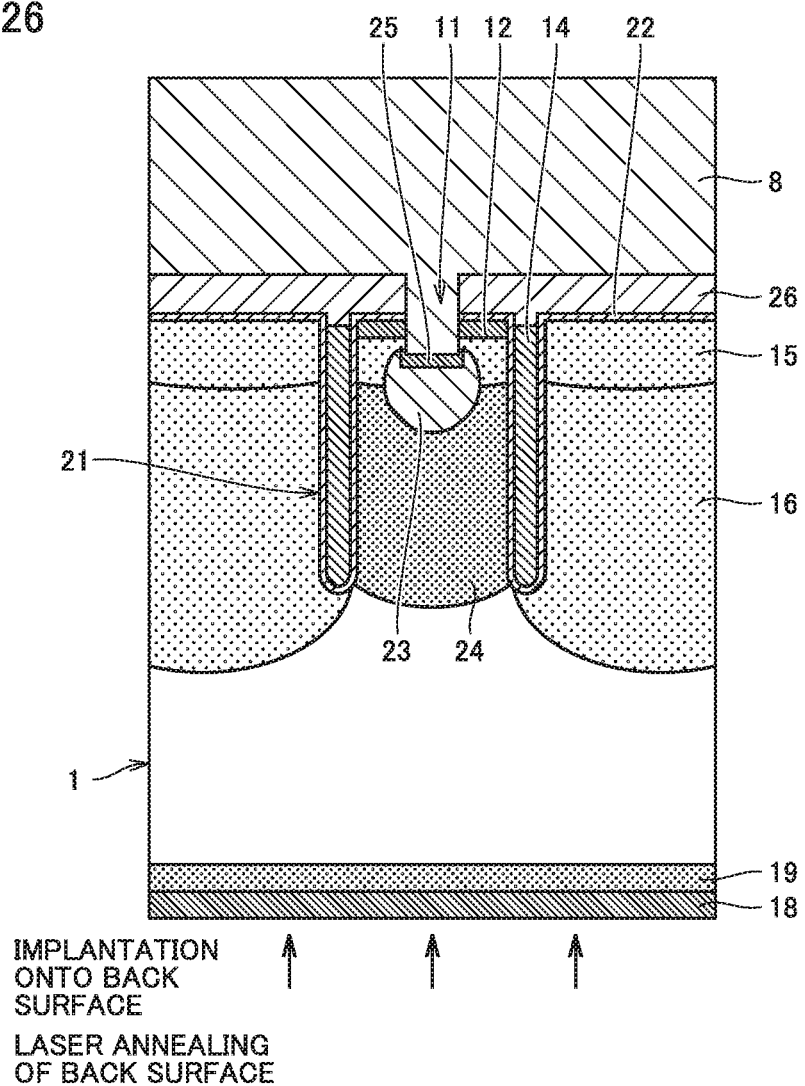
FIG. 26 is a schematic cross-sectional view showing the nineteenth step of the method of manufacturing a semiconductor device according to the first embodiment.

FIG. 26 is a schematic cross-sectional view showing the nineteenth step of the method of manufacturing a semiconductor device according to the first embodiment.

As shown in FIG. 26, for example, ions are implanted from the back surface 1b side of the thinned wafer over its entire surface, thereby introducing N type buffer region 19 into the surface region on back surface 1b of the wafer (into N− type drift region 20 before introduction). Examples of ion implantation conditions suitably used in this case may be as follows. Specifically, ion species: phosphorus, implantation method: nearly vertical implantation, implantation energy: about 350 KeV, dose amount for one implantation: $7 \times 10^{12}/\text{cm}^2$, and the number of times of implantation: one.

Then, for example, ions are implanted from the back surface 1b side of the wafer over almost its entire surface, thereby introducing P+ type collector region 18 into the surface region on back surface 1b of the wafer (into N− type drift region 20 before introduction of N type buffer region 19). Examples of ion implantation conditions suitably used in this case may be as follows. Specifically, ion species: boron, implantation method: nearly vertical implantation, implantation energy: about 40 KeV, dose amount for one implantation: about $1 \times 10^{13}/\text{cm}^2$, and the number of times of implantation: one.

Then, activation annealing is carried out for P+ type collector region 18 extending over almost the entire back surface 1b of the wafer (the activation rate is for example about 40%, and suitably in a range from about 30% to about 64%). Examples of the annealing conditions (laser irradiation conditions) suitably used in this case are as follows. Specifically, the annealing method: laser irradiation from the back surface 1b side of the wafer, wavelength: 527 nm, pulse width: about 100 ns, energy density: about 1.8 J/cm$^2$, irradiation mode: 2-pulse mode, delay time of both pulses: about 500 ns, and pulse overlapping rate: about 66%.

Then, metal collector electrode 17 is formed on almost the entire back surface 1b of the semiconductor wafer, for example, by sputtering film formation. Thereby, the state shown in FIG. 7 is completed. Then, the semiconductor wafer is divided into chip regions by dicing or the like, and sealed into a package as required, so that a device is completed.

<Process of Manufacturing Peripheral Element>

The process of manufacturing a gate protective diode, a temperature sensing diode, and a fuse element will be hereinafter described in the present example.

As to a fuse element, an explanation will be given with regard to the case where three types of fuse elements are provided.

Figure 27:
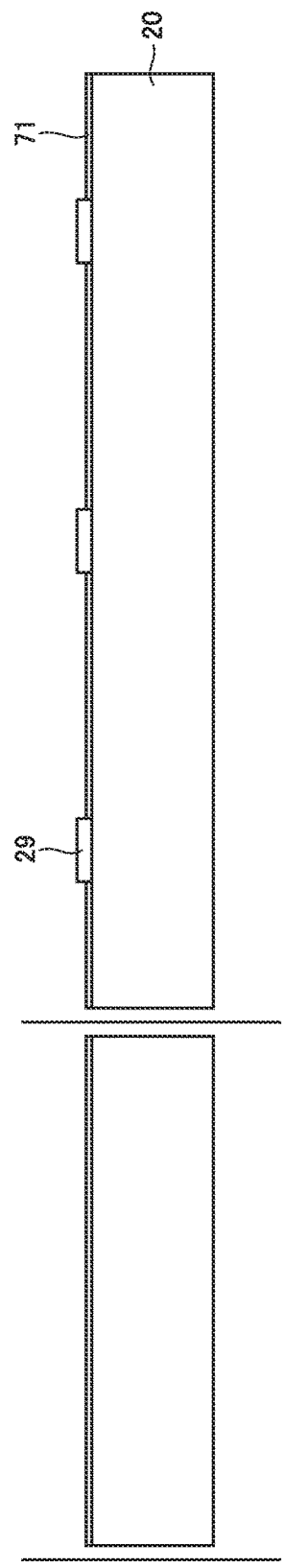
FIG. 27 is a schematic cross-sectional view showing the first step of a method of manufacturing a semiconductor device (peripheral element) according to the first embodiment.

FIG. 27 is a schematic cross-sectional view showing the first step of the method of manufacturing a semiconductor device (peripheral element) according to the first embodiment.

As shown in FIG. 27, a field silicon oxide film 29 having a thickness of about 950 nm is formed, for example, by thermal oxidation on almost the entire surface 1a (the first main surface) of the wafer. Field silicon oxide film 29 is patterned by normal lithography. Then, field silicon oxide film 29 is processed by etching according to patterning. Then, an unnecessary resist film is removed, for example, by ashing or the like. In addition, a silicon film 39 for isolating the diffusion layer provided in the termination structure is also formed in the same step as that of this field silicon oxide film 29. Field silicon oxide film 29 is designed to have a thickness of 300 nm or more, for example.

Then, a thin silicon oxide film 71 for ion implantation is formed to have a thickness of about 30 nm on almost the entire surface 1a of the wafer, for example, by thermal oxidation.

Figure 28:
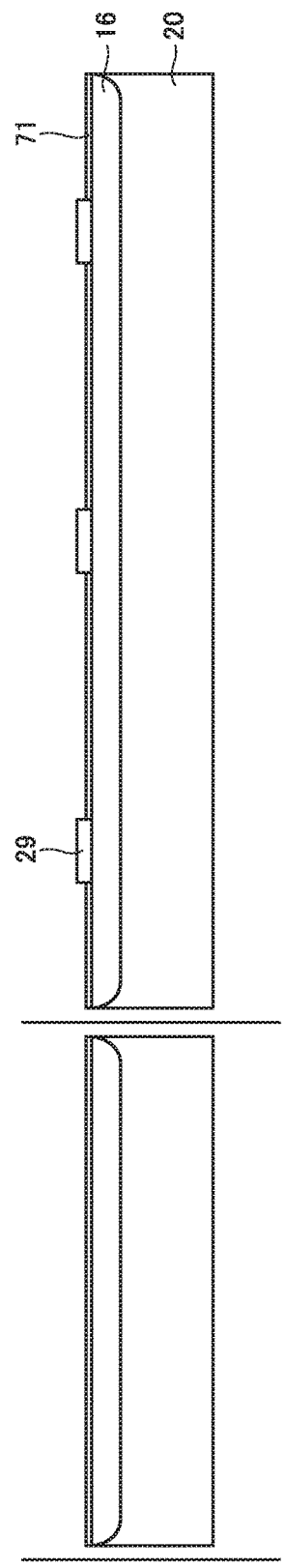
FIG. 28 is a schematic cross-sectional view showing the second step of the method of manufacturing a semiconductor device (peripheral element) according to the first embodiment.

FIG. 28 is a schematic cross-sectional view showing the second step of the method of manufacturing a semiconductor device (peripheral element) according to the first embodiment. In this case, a P type floating region introducing resist film is formed on surface 1a of the wafer, for example, by normal lithography. Then, this P type floating region introducing resist film is used as a mask for ion implantation, thereby forming a P type floating region 16 in the same manner as with a cell region. Furthermore, a diffusion layer in the termination structure is similarly formed. In addition, a diffusion layer for forming a non-trimming element is also similarly formed.

Figure 29:
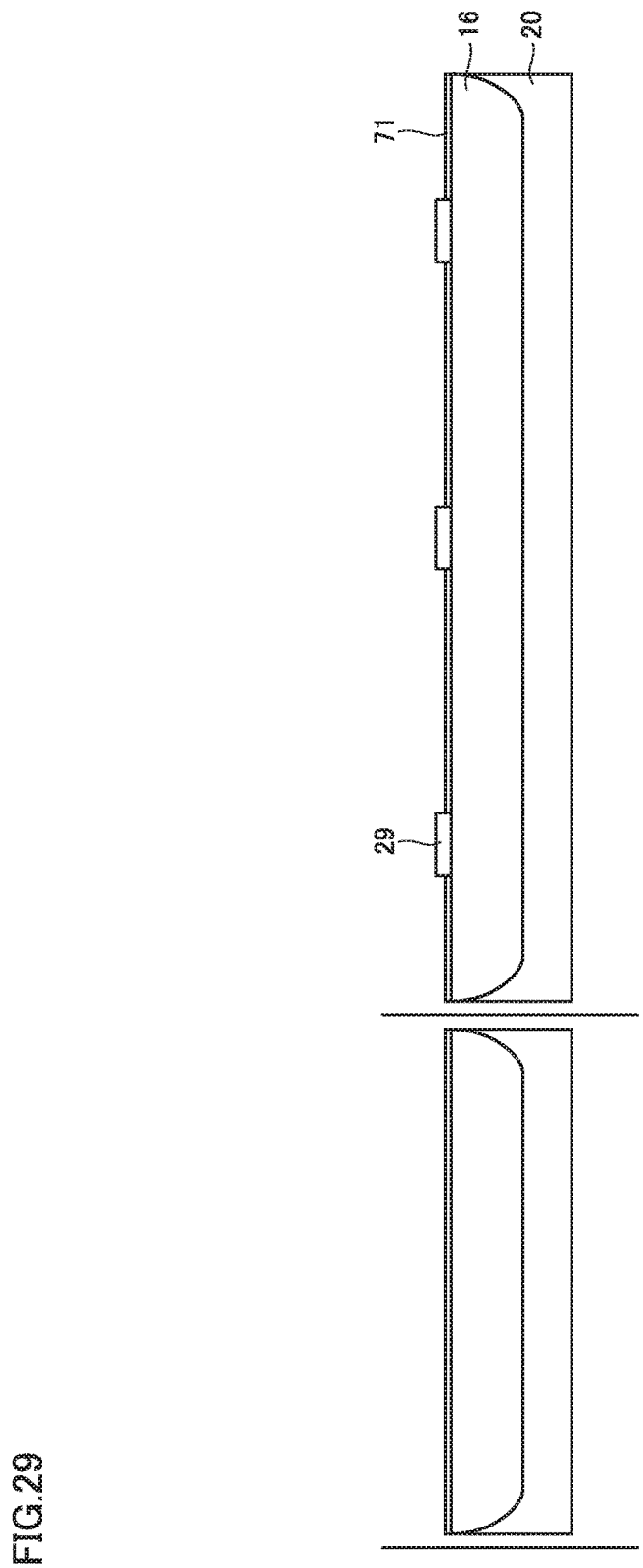
FIG. 29 is a schematic cross-sectional view showing the third step of the method of manufacturing a semiconductor device (peripheral element) according to the first embodiment.

FIG. 29 is a schematic cross-sectional view showing the third step of the method of manufacturing a semiconductor device (peripheral element) according to the first embodiment.

As shown in FIG. 29, stretching for diffusion is performed simultaneously with stretching for diffusion of P type floating region 16 and the like in the cell region. The diffusion layer in the termination structure is also stretched to be diffused.

Figure 30:
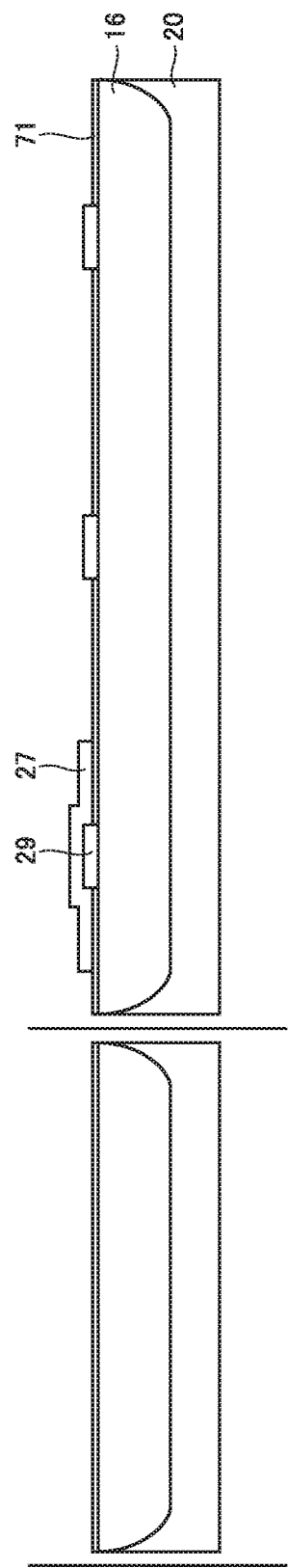
FIG. 30 is a schematic cross-sectional view showing the fourth step of the method of manufacturing a semiconductor device (peripheral element) according to the first embodiment.

FIG. 30 is a schematic cross-sectional view showing the fourth step of the method of manufacturing a semiconductor device (peripheral element) according to the first embodiment.

As shown in FIG. 30, a polysilicon film 27 of the first fuse element is formed, for example, by CVD on almost the entire surface 1a (including an inner surface of trench 21) of the wafer simultaneously with polysilicon film 27 in a cell region 10. Polysilicon film 27 is patterned by normal lithography. Then, polysilicon film 27 is processed by etching according to patterning. Then, an unnecessary resist film is removed, for example, by ashing or the like.

Figure 31:
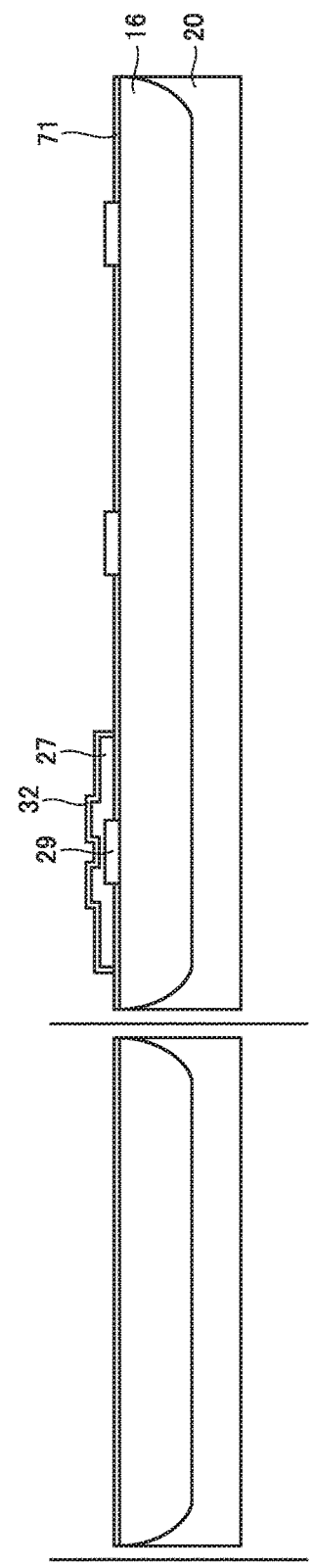
FIG. 31 is a schematic cross-sectional view showing the fifth step of the method of manufacturing a semiconductor device (peripheral element) according to the first embodiment.

FIG. 31 is a schematic cross-sectional view showing the fifth step of the method of manufacturing a semiconductor device (peripheral element) according to the first embodiment.

As shown in FIG. 31, polysilicon film 27 is patterned for providing an opening so as to be opened upward by normal lithography. Then, a part of polysilicon film 27 is processed by etching according to patterning. Then, an unnecessary resist film is removed, for example, by ashing or the like. Then, a silicon oxide film 32 is formed.

The thickness of the polysilicon film in the region having an opening provided as shown in FIG. 31 is adjusted by etching. The thickness of the polysilicon film is adjusted to be 200 nm or less.

Fuse cutting can be done accurately and highly precisely by the etching process for reducing the thickness of the polysilicon film in this fuse cutting region.

In addition, polysilicon film 27 of the first fuse element is formed in the same step as that for a polysilicon film forming agate electrode in an IGBT cell.

Figure 32:
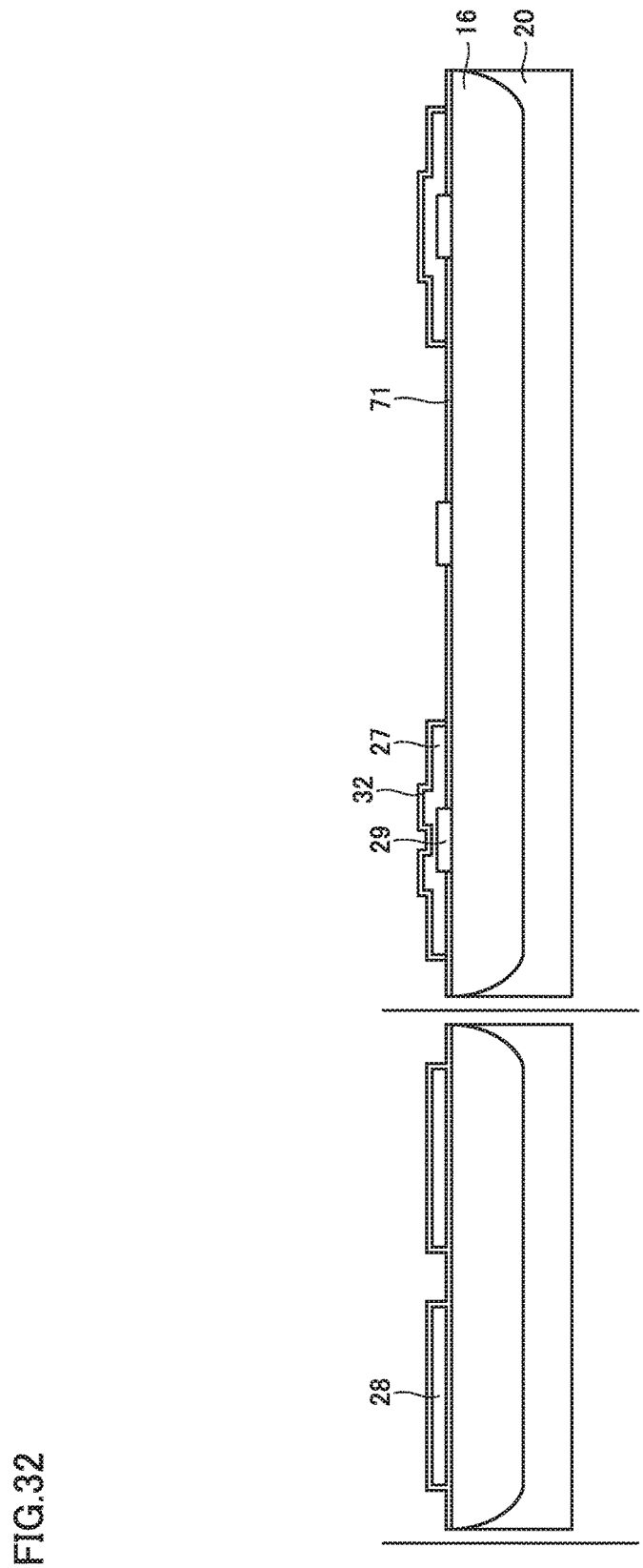
FIG. 32 is a schematic cross-sectional view showing the sixth step of the method of manufacturing a semiconductor device (peripheral element) according to the first embodiment.

FIG. 32 is a schematic cross-sectional view showing the sixth step of the method of manufacturing a semiconductor device (peripheral element) according to the first embodiment.

As shown in FIG. 32, a gate protective diode, a temperature sensing diode, and a polysilicon film 28 of the third fuse element are formed, for example, by CVD.

After ion implantation, an activation annealing process is performed. Then, polysilicon film 28 is patterned by normal lithography. Then, polysilicon film 28 is processed by etching according to patterning. Then, an unnecessary resist film is removed, for example, by ashing or the like.

Then, a silicon oxide film is formed.

As shown in FIG. 32, formation of the third fuse element, and formation of the gate protective diode and the temperature sensing diode are carried out in the same step.

Figure 33:
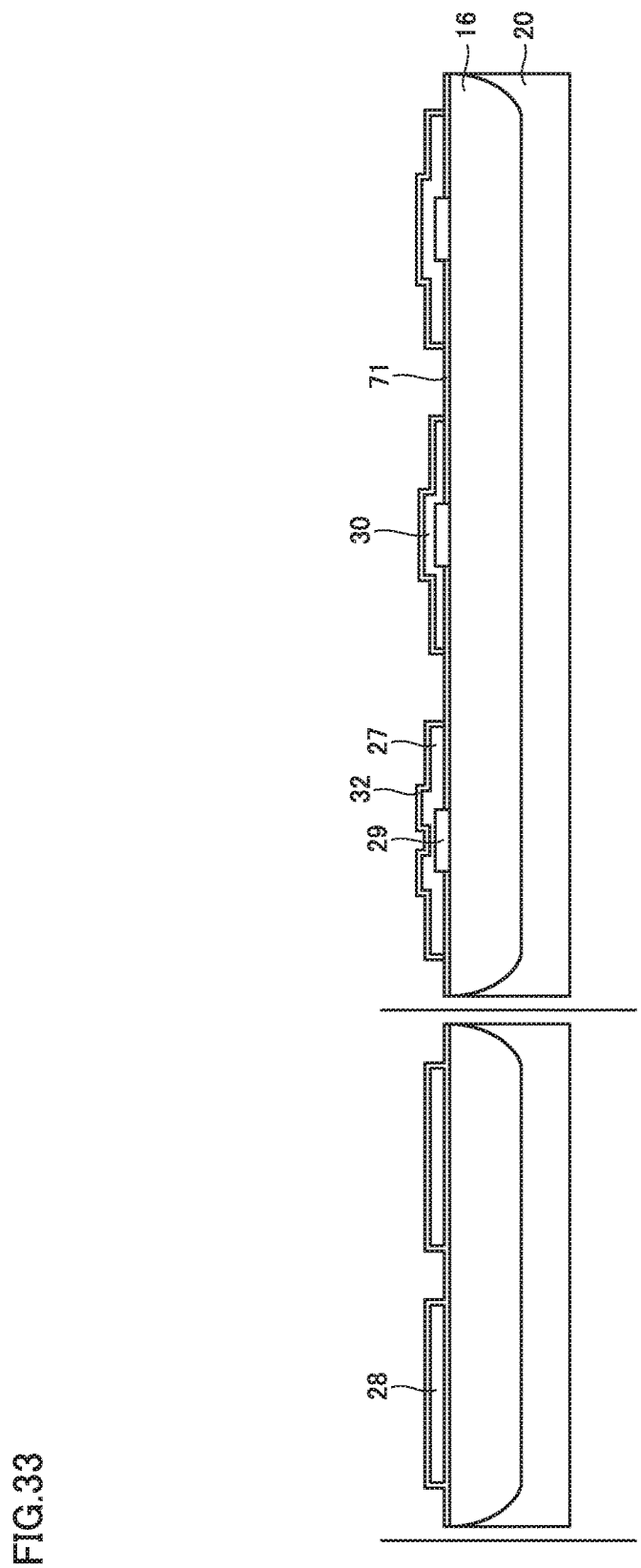
FIG. 33 is a schematic cross-sectional view showing the seventh step of the method of manufacturing a semiconductor device (peripheral element) according to the first embodiment.

FIG. 33 is a schematic cross-sectional view showing the seventh step of the method of manufacturing a semiconductor device (peripheral element) according to the first embodiment.

As shown in FIG. 33, a polysilicon film 30 of the second fuse element is formed, for example, by CVD.

Then, polysilicon film 30 is patterned by normal lithography. Then, polysilicon film 30 is processed by etching according to patterning. Then, an unnecessary resist film is removed, for example, by ashing or the like.

Then, a silicon oxide film is formed.

Figure 34:
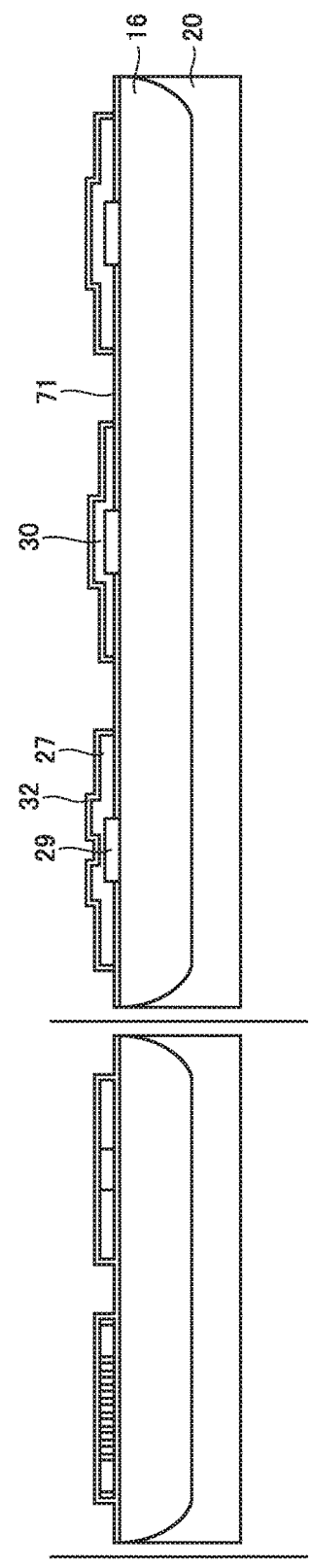
FIG. 34 is a schematic cross-sectional view showing the eighth step of the method of manufacturing a semiconductor device peripheral element according to the first embodiment.

FIG. 34 is a schematic cross-sectional view showing the eighth step of the method of manufacturing a semiconductor device (peripheral element) according to the first embodiment.

As shown in FIG. 34, a PN junction is formed by introducing P type impurities and N type impurities by ion implantation into the semiconductor substrate of the semiconductor wafer located close to surface 1a (the first main surface).

Figure 35:
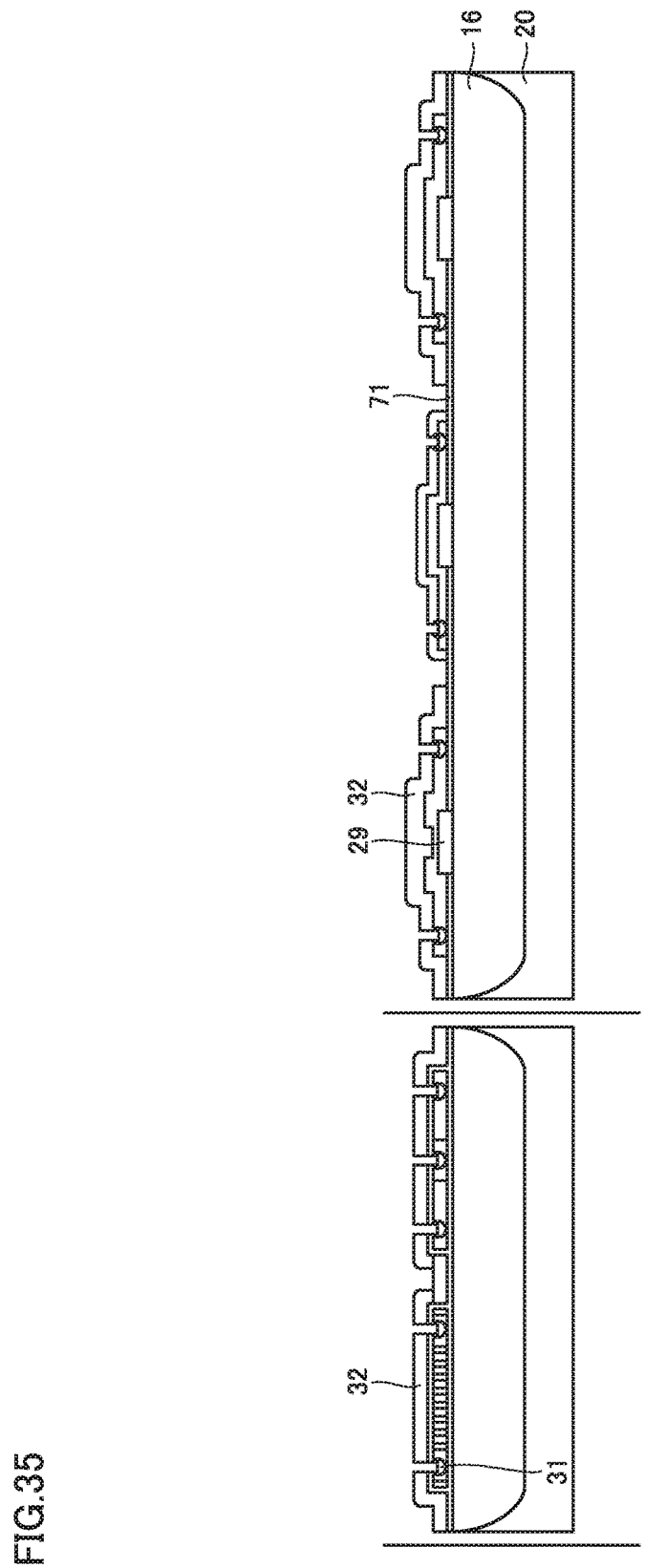
FIG. 35 is a schematic cross-sectional view showing the ninth step of the method of manufacturing a semiconductor device (peripheral element) according to the first embodiment.

FIG. 35 is a schematic cross-sectional view showing the ninth step of the method of manufacturing a semiconductor device (peripheral element) according to the first embodiment.

As shown in FIG. 35, a contact groove forming resist film is formed by normal lithography. Then, a contact groove is provided. P type impurities are ion-implanted through this contact groove, thereby forming a P+ type body contact region 31. Then, an interlayer insulating film 32 is formed, for example, by CVD or the like, for example, on almost the entire surface 1a of the semiconductor wafer. Formation of this interlayer insulating film 32 is carried out in the same step as that for forming interlayer insulating film 26 in the IGBT, as having been described with reference to FIG. 20. In addition, the interlayer insulating film in the termination structure is also formed in the same step.

Figure 36:
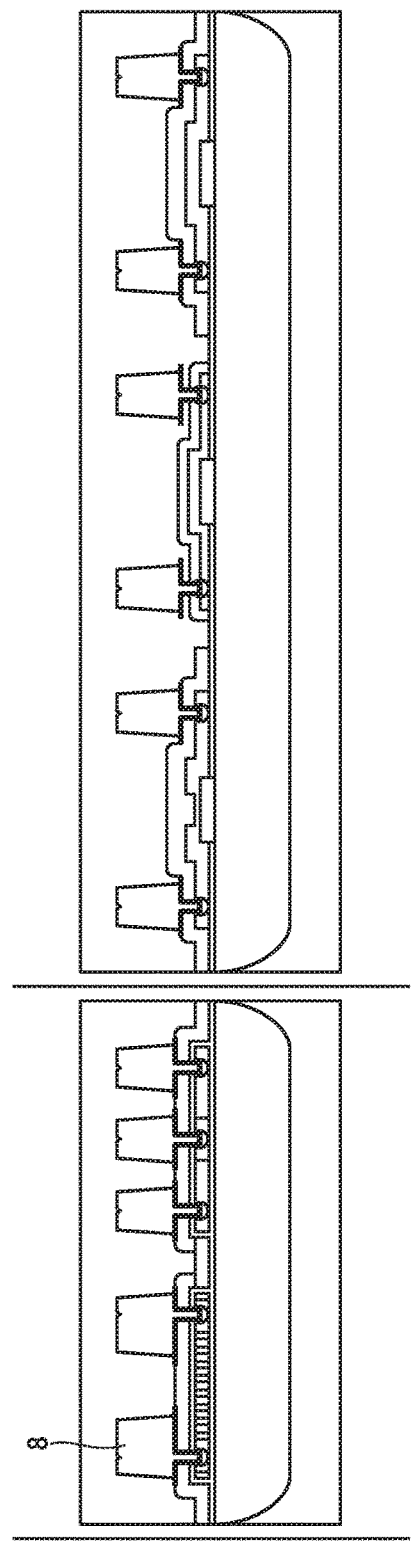
FIG. 36 is a schematic cross-sectional view showing the tenth step of the method of manufacturing a semiconductor device (peripheral element) according to the first embodiment.

FIG. 36 is a schematic cross-sectional view showing the tenth step of the method of manufacturing a semiconductor device (peripheral element) according to the first embodiment.

As shown in FIG. 36, an aluminum-based electrode film 8 (serving as a metal emitter electrode 8) is formed, for example, by sputtering or the like. Then, a cover insulating film made of polyimide or the like of about 10 µm thickness is formed over the entire surface of aluminum-based electrode film 8 for protecting this aluminum-based electrode film 8.

Figure 37:
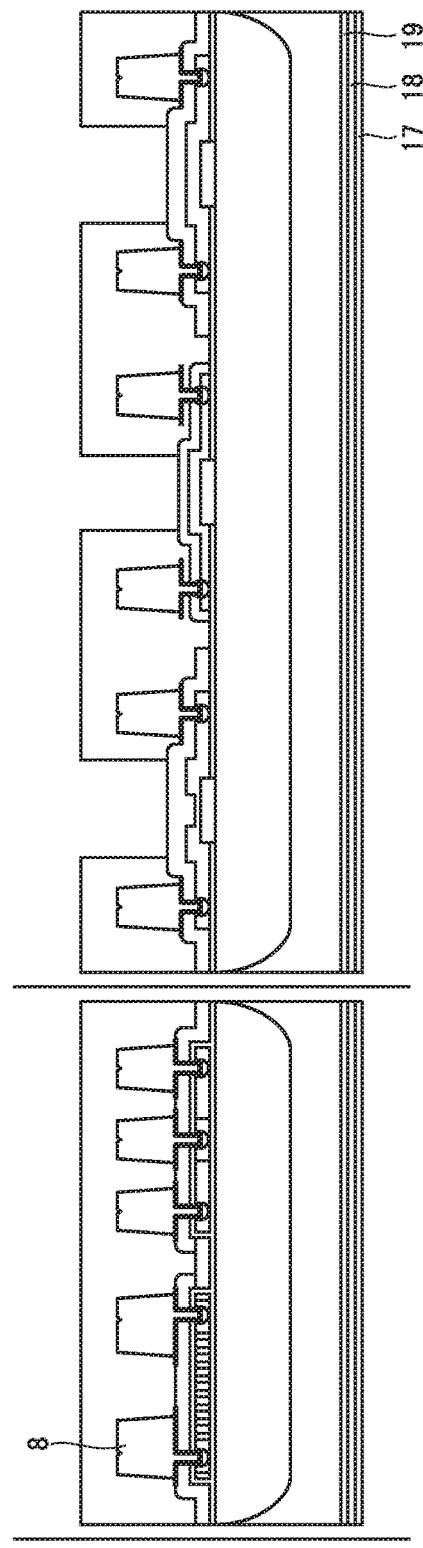
FIG. 37 is a schematic cross-sectional view showing the eleventh step of the method of manufacturing a semiconductor device (peripheral element) according to the first embodiment.

FIG. 37 is a schematic cross-sectional view showing the eleventh step of the method of manufacturing a semiconductor device (peripheral element) according to the first embodiment.

As shown in FIG. 37, a fuse cutting region and a region for providing an opening in aluminum-based electrode film 8 are patterned by normal lithography. Then, the cover insulating film is processed by etching according to patterning. Then, an unnecessary resist film is removed, for example, by ashing or the like.

Furthermore, for example, ions are implanted from the back surface 1b side of the wafer over almost its entire surface, thereby introducing P+ type collector region 18 into the surface region of back surface 1b of the wafer (into N− type drift region 20 before introduction of N type buffer region 19). Then, activation annealing is performed for P+ type collector region 18 extending on almost the entire back surface 1b of the wafer. A metal collector electrode 17 is formed on almost the entire back surface 1b of the semiconductor wafer, for example, by sputtering film formation.

<Step of Trimming Fuse Element>

Then, an explanation will be hereinafter given with regard to the case where a fuse element is cut by laser trimming.

Figure 38:
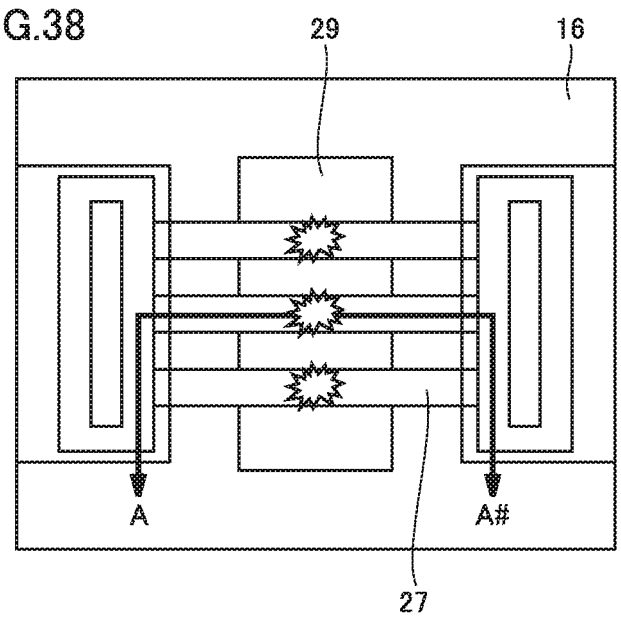
FIG. 38 is a diagram illustrating the case where a fuse element provided in the semiconductor device is seen from above.

FIG. 38 is a diagram illustrating the case where a fuse element provided in the semiconductor device is seen from above.

Figure 39:
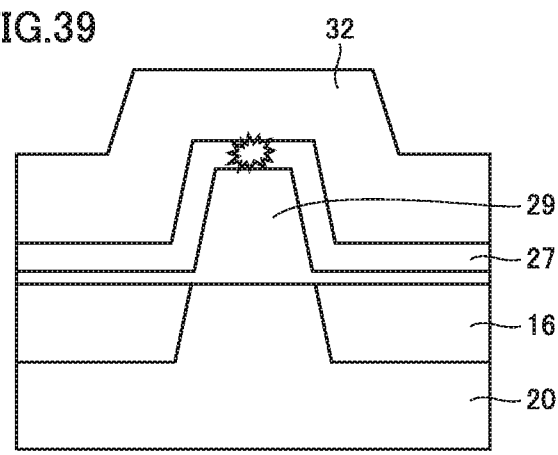
FIG. 39 is a diagram illustrating a schematic cross section of the fuse element provided in the semiconductor device.

FIG. 39 is a diagram illustrating a schematic cross section of the fuse element provided in the semiconductor device.

As shown in FIG. 38, polysilicon film 27, which is to be cut, of the fuse element is formed on field silicon oxide film 29.

A resistor formed of a fuse element and a non-trimming element is formed so as to extend across field silicon oxide film 29 that is partially formed. A plurality of fuse elements are formed, each of which is made of a conductive layer (polysilicon film) such as a polycrystalline silicon layer.

Furthermore, the periphery of the cutting region in the fuse element is surrounded by P type floating region 16. P type floating region 16 is designed to be set at an electric potential of 0V or about 0V when a voltage of several hundred volts to several thousand volts is applied.

This leads to a configuration in which a drain voltage (collector potential) of several hundred volts to several thousand volts is not applied to a fuse element.

The width of the cutting region in one direction is set at a value of about 16 µm or less such that carriers in a junction between the P type floating region and the N type semiconductor substrate is uniformly depleted when a voltage of several hundred volts to several thousand volts is applied to a collector electrode.

Thereby, application of a high voltage between the fuse element and the semiconductor substrate can be suppressed, so that a fuse element capable of ensuring a withstand voltage can be implemented.

As shown in FIG. 39, in a region in which a fuse element is cut by laser trimming, the film is formed to have a thickness of 300 nm or more, so that the heat generated during laser cutting does not exert an influence upon the semiconductor substrate.

Interlayer insulating film 32 formed of a PSG layer and an SOG film of about 600 nm is provided above the semiconductor substrate and field silicon oxide film 29, and formed so as to cover the entire upper surface of the fuse element. As having been described with reference to FIG. 36, interlayer insulating film 32 is provided with an opening as a contact portion between the resistance of the non-trimming element and the aluminum electrode. Aluminum-based electrode film 8 is formed in a contact region.

A cover insulating film made of polyimide or the like of about 10 µm is provided on interlayer insulating film 32 and aluminum-based electrode film 8. As having been described in FIG. 37, the cover insulating film may be partially removed from the upper portion of the fuse cutting region so as to provide a fuse opening. Generally, etching for providing a fuse window is performed simultaneously with formation of an opening in the bonding pad, and only the interlayer insulating film is formed on the fuse. Laser ablation can be also performed without providing a fuse window. However, if a fuse window is provided, the film thickness on the fuse can be reduced. This brings about advantages that the total power required for laser ablation can be decreased, the throughput can be increased, and laser ablation can be controlled with high precision.

Figure 40:
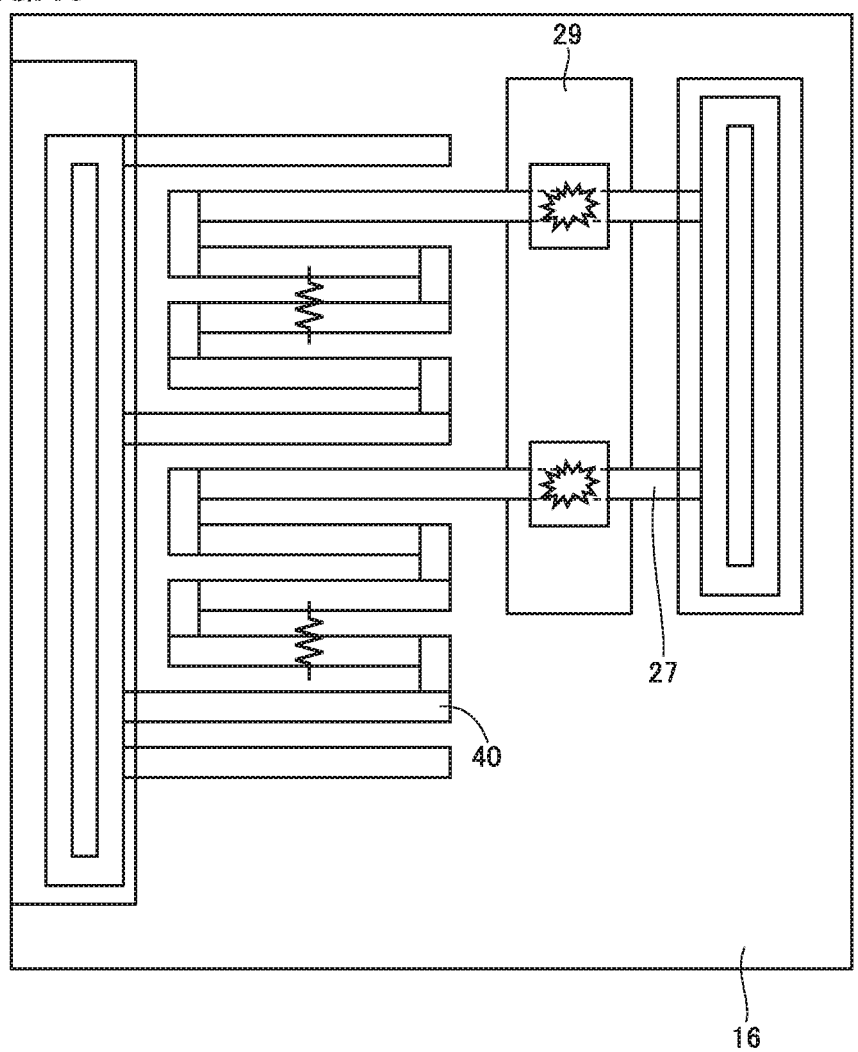
FIG. 40 is a diagram illustrating a trimming element connected to the fuse element according to an embodiment.

FIG. 40 is a diagram illustrating a trimming element connected to the fuse element according to an embodiment.

As shown in FIG. 40, trimming element 40 is formed as a resistor that is formed by folding back polysilicon film 27. Trimming element 40 is connected to the fuse element, and has a resistance value that is adjusted by laser trimming.

Second Embodiment

Since field silicon oxide film 29 is formed by thermal oxidation, a significantly large height difference occurs in the oxide film (the aspect ratio is relatively large), so that polysilicon film 27 may remain in the region having a height difference in field silicon oxide film 29.

When a polysilicon film is formed as a fuse element, a leak path may occur between the fuses.

Figure 41:
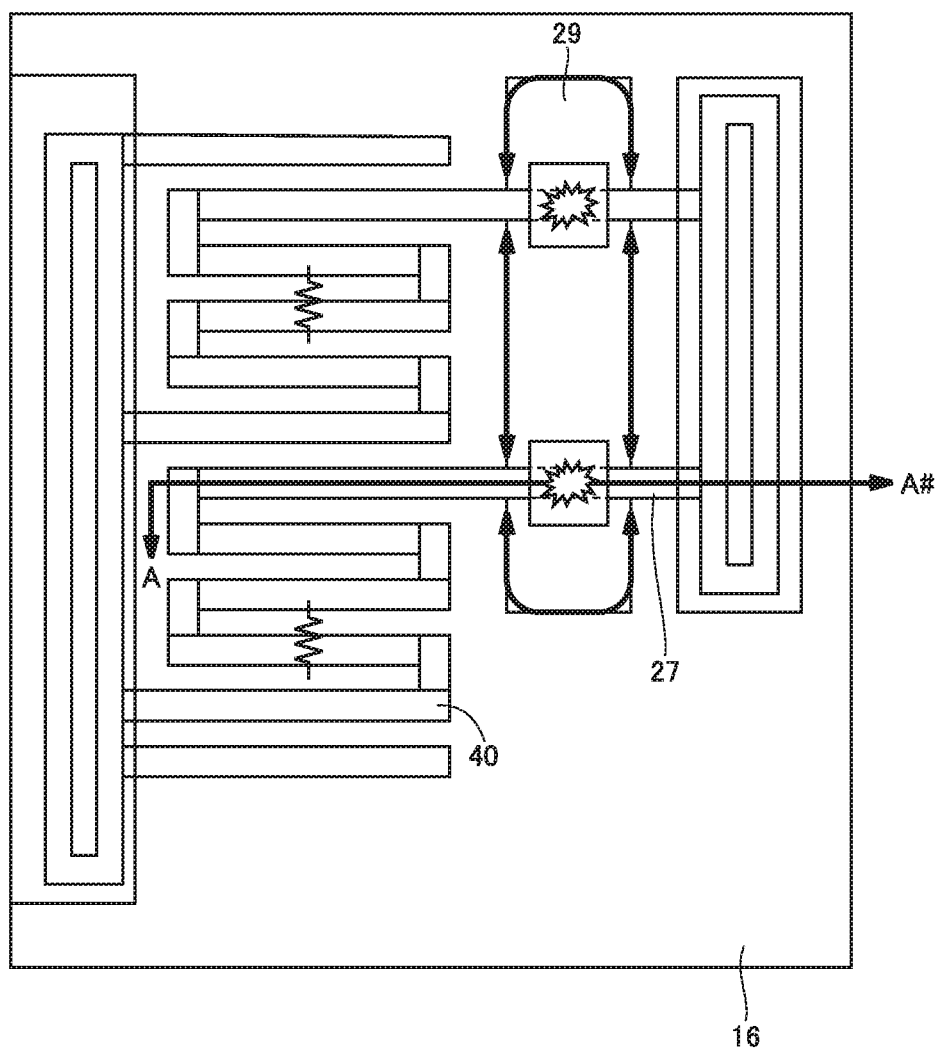
FIG. 41 is a diagram illustrating a leak path according to the second embodiment.

FIG. 41 is a diagram illustrating a leak path according to the second embodiment.

As shown in FIG. 41, current sneaking (a leak path) may occur through polysilicon film 27 remaining in the region having a height difference in field silicon oxide film 29.

Figure 42:
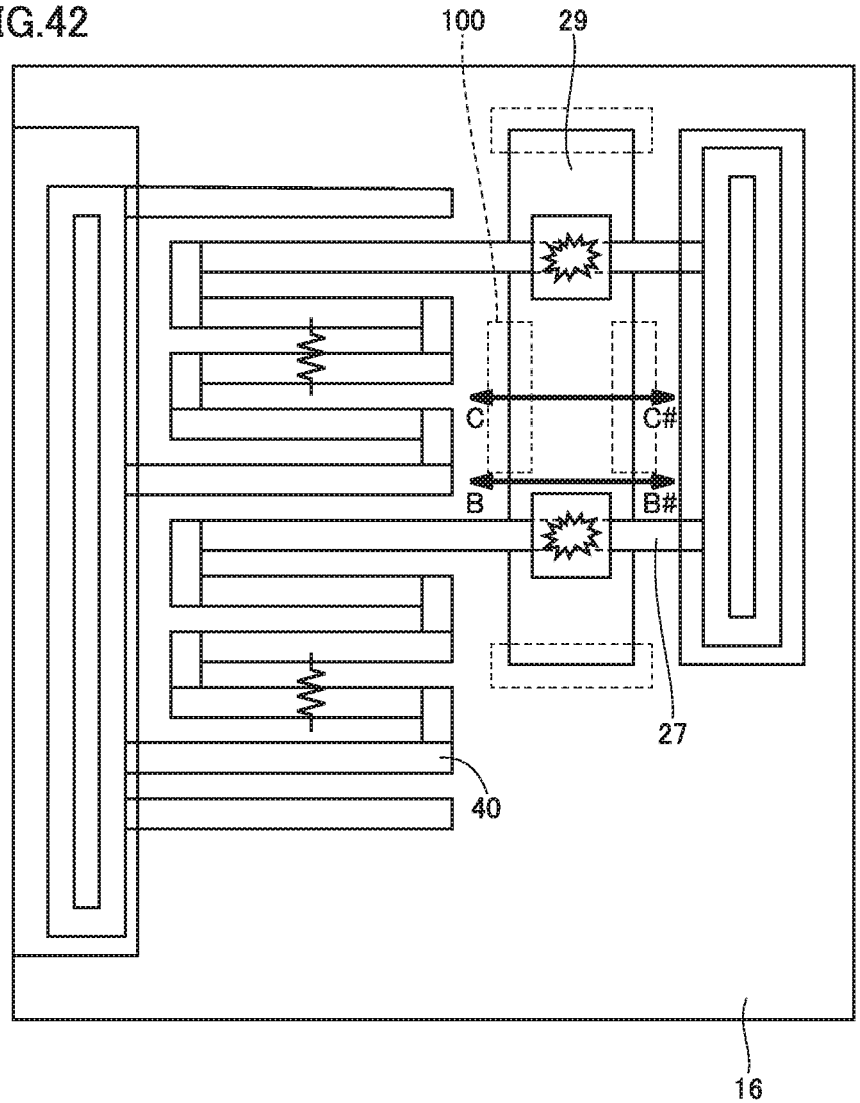
FIG. 42 is a diagram illustrating an etching step according to the second embodiment.

FIG. 42 is a diagram illustrating an etching step according to the second embodiment.

As shown in FIG. 42, an etching process described in FIG. 31 is performed for at least one region in an area having a height difference in field silicon oxide film 29. The figure shows the case where the etching process is performed in each of four regions 100.

Figure 43A:
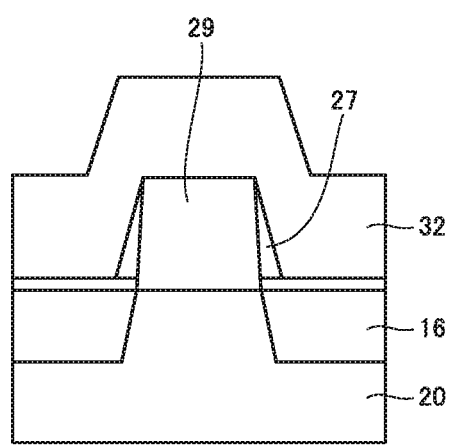
FIGS. 43A and 43B are diagrams each illustrating a cross section structure of a fuse element according to the second embodiment.
Figure 43B:
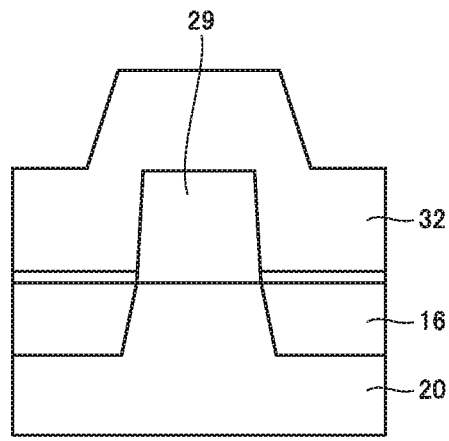

FIGS. 43A and 43B are diagrams each illustrating a cross section structure of a fuse element according to the second embodiment.

FIG. 43A shows across section structure taken along B-B# in FIG. 42 that is not subjected to etching processing, in which polysilicon film 27 remains in a portion having a height difference.

On the other hand, FIG. 43B shows a cross section structure taken along C-C# in FIG. 42 that is subjected to etching processing, in which polysilicon film 27 remaining in a portion having a height difference is removed.

Thereby, the problem about the leak path between fuses can be solved, so that a stable fuse element can be implemented.

Third Embodiment

Since field silicon oxide film 29 is formed readily and inexpensively by thermal oxidation, a significantly large height difference occurs in the oxide film (the aspect ratio is relatively large), so that the polysilicon film may be reduced in thickness in a region having a height difference in the silicon oxide film.

Furthermore, the focus may be displaced in the region having a height difference during photomask exposure, and the resultant wiring width may be relatively narrow. Thereby, a faulty fuse element may be produced due to disconnection or the like.

Figure 44:
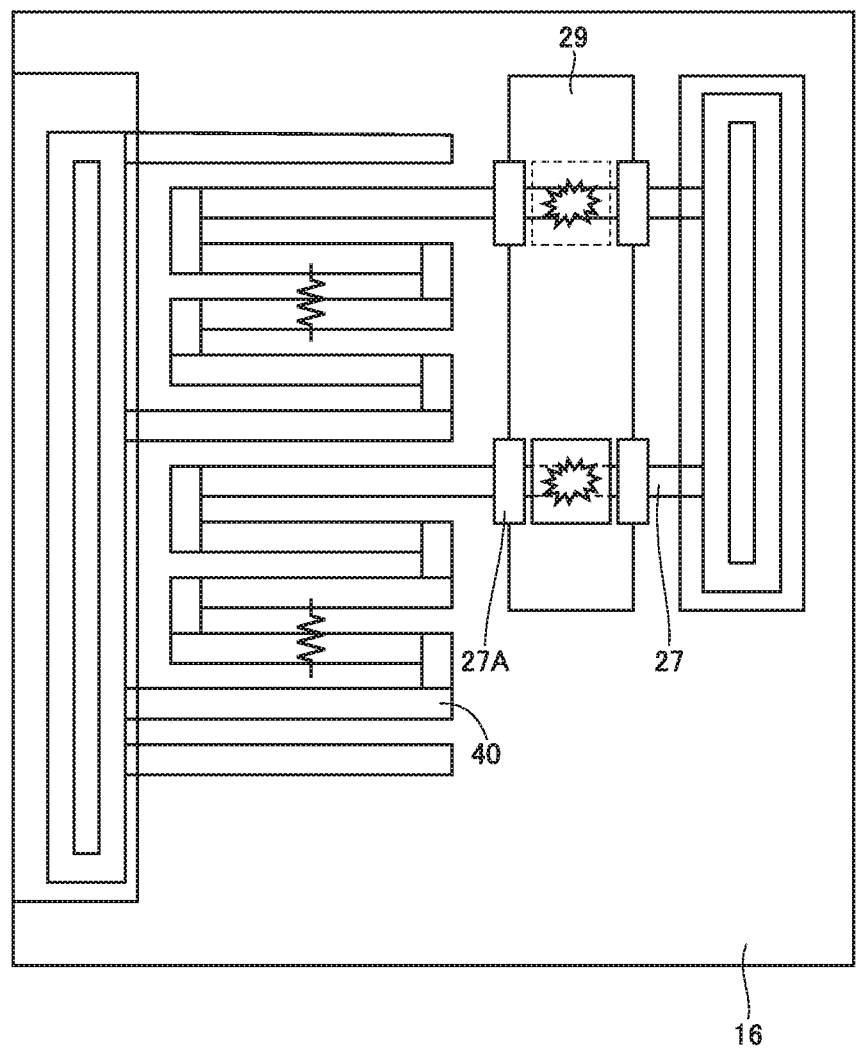
FIG. 44 is a diagram illustrating formation of a polysilicon film according to the third embodiment.

FIG. 44 is a diagram illustrating formation of a polysilicon film according to the third embodiment.

As shown in FIG. 44, a polysilicon film formed so as to extend across field silicon oxide film 29 is designed such that a region crossing the field silicon oxide film 29 (a region having a height difference) is formed to have a wiring width thicker than the normal wiring width. In the present example, some polysilicon films 27A are shown that are formed to be relatively thick by way of example. For example, the width of the polysilicon film can be adjusted in the steps shown in FIG. 30 and the like, as described above.

The above-described configuration can solve the problems about a faulty fuse element caused by wiring disconnection or the like.

Fourth Embodiment

According to the method of manufacturing a semiconductor device (IGBT), for suppressing a parasitic NPN operation, an N type semiconductor substrate is also etched in the contact step simultaneously with etching of the interlayer insulating film, which is followed by formation of a P+ back gate layer.

In this point, in the case where polysilicon film 27 is formed to be relatively thin during formation of a contact, in the contact region in the resistance of the fuse or the non-trimming element, a contact penetrates through thin polysilicon film 27 during etching of the semiconductor substrate when providing an opening as a contact. This may cause a short circuit with P type floating region 16 existing therebelow.

Figure 45A:
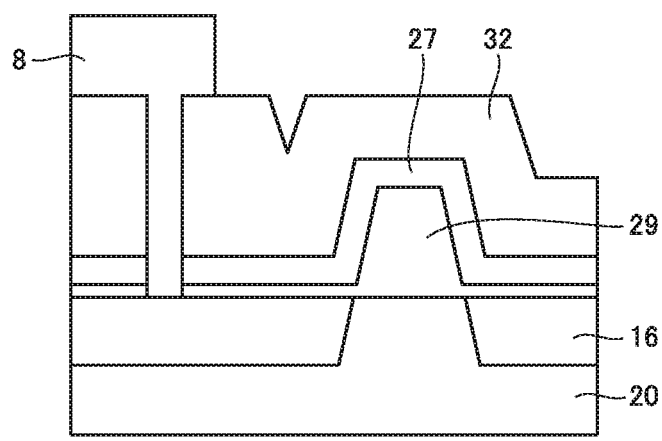
FIGS. 45A and 45B are diagrams each illustrating a contact according to the fourth embodiment.
Figure 45B:
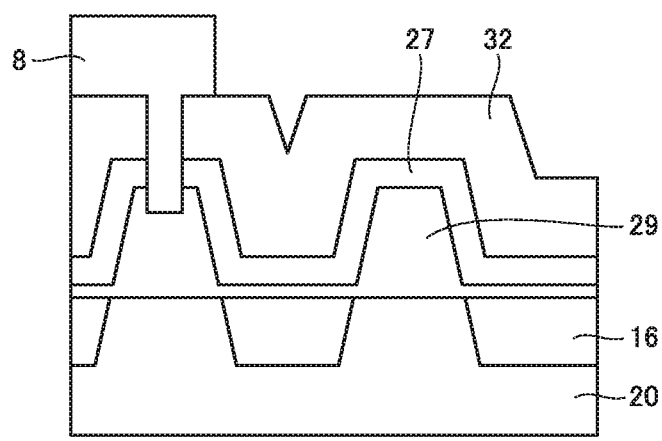

FIGS. 45A and 45B are diagrams each illustrating a contact according to the fourth embodiment.

FIG. 45A shows the case where a contact penetrates through thin polysilicon film 27, thereby causing a short circuit with P type floating region 16 existing therebelow.

In FIG. 45B, a contact region in the resistance of the fuse or the non-trimming element formed of thin polysilicon film 27 is formed on field silicon oxide film 29 surrounded by P type floating region 16.

Thereby, even if a contact penetrates through a film during formation of this contact, this penetration stops in the middle of the field silicon oxide film. Accordingly, insulation between field silicon oxide film 29 and the semiconductor substrate can be reliably ensured. Although an explanation has been given with regard to the case where the above-described method is employed for thin polysilicon film 27, this method may be employed for a thick polysilicon film.

In addition, in the case where an electric potential varies, etching may be carried out in combination with the above-described second embodiment, so as to prevent current sneaking (a leak path) through polysilicon film 27 remaining in the region having a height difference in field silicon oxide film 29. The present technique may be applied not only to the case where the electric potential is not the same but also to the case where the electric potential is the same.

Fifth Embodiment

When the resistance element of the non-trimming element as described in the above embodiment is formed of polysilicon film 29 used also for agate electrode, the sheet resistance is about 15Ω/□ by way of example.

Generally, since a trimming resistance for a fuse is formed of a plurality of unit resistances of several kΩ that are connected in parallel or in series, the L/W ratio of the resistances is increased by about 100 times, thereby requiring a large-area region for resistance arrangement.

In the IGBT incorporating a temperature sensing diode, the gate protective diode and the temperature sensing diode are made of the same type of polysilicon film, as having been described above. The P type layer (P layer) for controlling the VF characteristics of the temperature sensing diode and the P type layer (PM layer) for controlling the breakdown voltage characteristics of the gate protective diode are controlled at their respective optimal concentrations.

For example, in the case where the P type layer (P layer) for controlling the VF characteristics is formed by ion implantation (for example, ion species: boron, and dose amount: about $2.5 \times 10^{15}/cm^2$), the sheet resistance is set at about 100 kΩ/□.

The sheet resistance formed of a polysilicon film is adjusted by ion implantation for controlling the VF characteristics.

The sheet resistance (about 2 kΩ/□) of the above-described PM layer and the sheet resistance (about 100 kΩ/□) of the P layer that are made of the same type of polysilicon film are connected in series so as to be designed in an optimal resistance length. Thereby, the resistance arrangement area is significantly reduced, and the chip area is reduced, so that cost reduction can be achieved. Also, since the resistance length is controlled by the P layer photomask, the resistance value can readily be adjusted.

Although the present disclosure has been specifically described based on the embodiments, the present disclosure is not limited to these embodiments but can be variously modified so as to fall within a scope without deviation from the features described above.

Although the embodiments of the present invention have been described as above, it should be understood that the embodiments disclosed herein are illustrative and non-restrictive in every respect. The scope of the present invention is defined by the terms of the claims, and is intended to include any modifications within the meaning and scope equivalent to the terms of the claims.

What is claimed is:
1. A semiconductor device comprising:
a semiconductor substrate having a main surface;
a first insulating film formed in a convex shape and provided on the main surface of the semiconductor substrate;
a first diffusion layer formed on the semiconductor substrate and provided to surround the first insulating film formed in a convex shape, the first diffusion layer being different in conductivity type from the semiconductor substrate;

a first conductive layer formed so as to extend across the first insulating film formed in a convex shape, the first conductive layer forming a fuse element; and a second insulating film provided on the first conductive layer;

wherein the semiconductor device includes a power transistor element electrically connected to the first conductive layer.

2. The semiconductor device according to claim 1, wherein the power transistor element has a drain or a collector, to which a high voltage is applied, and the first diffusion layer is set at an electric potential of a ground voltage or about the ground voltage.

3. The semiconductor device according to claim 1, wherein the power transistor element includes trench gate electrodes and a second diffusion layer provided between the trench gate electrodes, and the second diffusion layer and the first diffusion layer are formed in an identical step.

4. The semiconductor device according to claim 3, further comprising a termination structure including a third insulating film for isolation, wherein the first insulating film and the third insulating film are formed in an identical step, and the first insulating film is formed to have a thickness of 300 nm or more.

5. The semiconductor device according to claim 1, wherein the power transistor element includes a gate electrode having a second conductive layer, and the first conductive layer of the fuse element and the second conductive layer of the gate electrode are formed in an identical step.

6. The semiconductor device according to claim 1, further comprising a termination structure that has a second diffusion layer formed in a ring shape and provided for suppressing an electric field concentration, wherein the second diffusion layer and the first diffusion layer are formed in an identical step.

7. The semiconductor device according to claim 1, wherein the first conductive layer extends across the first insulating film in a first direction, and wherein the first insulating film formed in a convex shape is formed to have a width of 20 μm or less in the first direction.

8. The semiconductor device according to claim 1, wherein the semiconductor device includes a diode element having a second conductive layer, and the first conductive layer of the fuse element and the second conductive layer of the diode element are formed in an identical step.

9. The semiconductor device according to claim 1, wherein the first conductive layer of the fuse element includes a prescribed region having a thickness that is adjusted by etching.

10. The semiconductor device according to claim 9, wherein the prescribed region in the first conductive layer of the fuse element is formed to have a thickness of 200 nm or less.

11. The semiconductor device according to claim 9, wherein the prescribed region in the first conductive layer of the fuse element is formed on the first insulating film.

12. The semiconductor device according to claim 9, wherein the first insulating film formed in a convex shape has an end that is removed by the etching.

13. The semiconductor device according to claim 1, wherein the first conductive layer of the fuse element is formed of a conductive layer intended for the fuse element.

14. The semiconductor device according to claim 1, wherein the first conductive layer formed on a side surface of the first insulating film formed in a convex shape is greater in width than the first conductive layer formed in a region other than the side surface.

15. The semiconductor device according to claim 1, further comprising a second conductive layer formed on the second insulating film, wherein a plurality of the first insulating films each formed in a convex shape is provided, the first conductive layer is formed so as to extend across the plurality of the first insulating films each formed in a convex shape, and the second conductive layer and the first conductive layer are connected by a region that is formed on at least one of the plurality of the first insulating films each formed in a convex shape.

16. The semiconductor device according to claim 1, wherein the fuse element is connected to a non-trimming element formed of a resistor provided based on a path length of the first conductive layer.

17. The semiconductor device according to claim 16, wherein the semiconductor device includes a diode element having a second conductive layer, and a sheet resistance of the first conductive layer and a sheet resistance of the second conductive layer are adjusted in an identical step.

18. A semiconductor device comprising:

a power transistor element; and a non-trimming element including a fuse element used for adjusting the transistor element, the fuse element including a semiconductor substrate having a main surface, a first insulating film formed in a convex shape and provided on the main surface of the semiconductor substrate, a first diffusion layer formed on the semiconductor substrate and provided to surround the first insulating film formed in a convex shape, the first diffusion layer being different in conductivity type from the semiconductor substrate, a first conductive layer formed so as to extend across the first insulating film formed in a convex shape, the first conductive layer forming a fuse element, and a second insulating film provided on the first conductive layer, the power transistor element being electrically connected to the first conductive layer and having a drain or a collector, to which a high voltage is applied, and the first diffusion layer being set at an electric potential of a ground voltage or about the ground voltage.

19. The semiconductor device according to claim 18, wherein the non-trimming element includes a second diffusion layer formed on the semiconductor substrate, and the first diffusion layer and the second diffusion layer are formed in an identical step.

20. A semiconductor device comprising:
a semiconductor substrate having a main surface;
a first insulating film formed in a convex shape and provided on the main surface of the semiconductor substrate;
a first diffusion layer formed on the semiconductor substrate and provided to surround the first insulating film formed in a convex shape, the first diffusion layer being different in conductivity type from the semiconductor substrate;
a first conductive layer formed so as to extend across the first insulating film formed in a convex shape, the first conductive layer forming a fuse element;
a second insulating film provided on the first conductive layer; and
a termination structure that has a second diffusion layer formed in a ring shape and provided for suppressing an electric field concentration, wherein the second diffusion layer and the first diffusion layer are formed in an identical step.

* * * * *